(12) United States Patent
Kiya et al.

(10) Patent No.: US 11,364,714 B2
(45) Date of Patent: Jun. 21, 2022

(54) FLUORORESIN BASE MATERIAL, PRINTED WIRING BOARD, AND CIRCUIT MODULE

(71) Applicants: SUMITOMO ELECTRIC PRINTED CIRCUITS, INC., Koka (JP); SUMITOMO ELECTRIC INDUSTRIES, LTD., Osaka (JP)

(72) Inventors: Satoshi Kiya, Koka (JP); Sumito Uehara, Koka (JP); Kousuke Miura, Koka (JP); Makoto Nakabayashi, Osaka (JP)

(73) Assignees: SUMITOMO ELECTRIC PRINTED CIRCUITS, INC., Koka (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 15/027,323

(22) PCT Filed: Oct. 8, 2014

(86) PCT No.: PCT/JP2014/076932
§ 371 (c)(1),
(2) Date: Apr. 5, 2016

(87) PCT Pub. No.: WO2015/053309
PCT Pub. Date: Apr. 16, 2015

(65) Prior Publication Data
US 2016/0250830 A1 Sep. 1, 2016

(30) Foreign Application Priority Data

Oct. 11, 2013 (JP) .............................. JP2013-214089
Oct. 11, 2013 (JP) .............................. JP2013-214090
Sep. 22, 2014 (JP) .............................. JP2014-192589

(51) Int. Cl.
*B32B 27/32* (2006.01)
*H05K 1/03* (2006.01)
(Continued)

(52) U.S. Cl.
CPC .............. *B32B 27/322* (2013.01); *B32B 7/12* (2013.01); *B32B 27/304* (2013.01);
(Continued)

(58) Field of Classification Search
CPC ............ H05K 3/20; H05K 3/389; H05K 3/89; H05K 2201/015; H05K 2201/0158;
(Continued)

(56) References Cited

U.S. PATENT DOCUMENTS 5,263,243 A * 11/1993 Taneda ................. H05K 3/0035
156/89.18
5,425,832 A * 6/1995 Kusano ................... B29C 59/12
156/272.6
(Continued)

FOREIGN PATENT DOCUMENTS

DE 4217076 A1 12/1992
JP S61-164816 A 7/1986
(Continued)

OTHER PUBLICATIONS

Machine Translation, Yokozuka et al, JP 08-134243A (1996).*
(Continued)

*Primary Examiner* — Monique R Jackson
(74) *Attorney, Agent, or Firm* — Faegre Drinker Biddle & Reath LLP

(57) ABSTRACT

A fluororesin base material containing a fluororesin as a main component includes a modified layer on at least a partial region of a surface thereof, the modified layer containing a siloxane bond and a hydrophilic organofunctional
(Continued)

group, and a surface of the modified layer having a contact angle of 90° or less with pure water.

17 Claims, 4 Drawing Sheets

(51) Int. Cl.
| | |
|---|---|
| *H05K 3/38* | (2006.01) |
| *B32B 7/12* | (2006.01) |
| *H05K 3/20* | (2006.01) |
| *B32B 27/30* | (2006.01) |
| *H05K 1/02* | (2006.01) |
| *H05K 3/28* | (2006.01) |
| *H05K 3/06* | (2006.01) |
| *H05K 3/00* | (2006.01) |

(52) U.S. Cl.
CPC ........... *H05K 1/0274* (2013.01); *H05K 1/034* (2013.01); *H05K 3/20* (2013.01); *H05K 3/386* (2013.01); *H05K 3/389* (2013.01); *B32B 2457/08* (2013.01); *H05K 1/024* (2013.01); *H05K 1/0366* (2013.01); *H05K 3/007* (2013.01); *H05K 3/067* (2013.01); *H05K 3/281* (2013.01); *H05K 3/285* (2013.01); *H05K 2201/015* (2013.01); *H05K 2201/0108* (2013.01); *H05K 2201/0158* (2013.01); *H05K 2201/0191* (2013.01); *H05K 2201/0195* (2013.01); *H05K 2201/0326* (2013.01); *H05K 2201/09781* (2013.01); *H05K 2201/2009* (2013.01); *H05K 2203/0264* (2013.01); *H05K 2203/0278* (2013.01); *H05K 2203/0376* (2013.01); *H05K 2203/0769* (2013.01); *H05K 2203/1173* (2013.01)

(58) Field of Classification Search
CPC ...... H05K 3/381; H05K 1/034; H05K 1/0274; H05K 3/38; B32B 7/12; B32B 27/322; B32B 15/08; B32B 15/085; B32B 2457/08; B32B 2307/412
USPC .................................................. 428/421, 422
See application file for complete search history.

(56) References Cited

U.S. PATENT DOCUMENTS

| | | | |
|---|---|---|---|
| 6,221,176 B1 * | 4/2001 | Merchant | ................ B32B 15/08 148/264 |
| 2004/0055503 A1 * | 3/2004 | Hasan | ...................... C25D 5/56 106/1.11 |
| 2004/0058112 A1 * | 3/2004 | Williams | .................. B32B 1/08 428/36.91 |
| 2006/0293459 A1 | 12/2006 | Yoshimoto et al. | |
| 2007/0141310 A1 * | 6/2007 | Song | ...................... H05K 1/036 428/209 |
| 2008/0107866 A1 * | 5/2008 | Iwasa | ..................... B32B 15/08 428/141 |
| 2016/0107376 A1 * | 4/2016 | Nakajima | ........... B29C 65/4865 428/216 |

FOREIGN PATENT DOCUMENTS

| | | | |
|---|---|---|---|
| JP | 07-170064 A | | 7/1995 |
| JP | 08134243 A | * | 5/1996 |
| JP | H08-134243 A | | 5/1996 |
| JP | 2001-358415 A | | 12/2001 |
| JP | 2003-201571 A | | 7/2003 |
| JP | 2004-536722 A | | 12/2004 |
| JP | 2009-263529 A | | 11/2009 |
| JP | 2011-148968 A | | 8/2011 |
| JP | 2012046781 A | * | 3/2012 |
| JP | 2013-049819 A | | 3/2013 |
| WO | WO 02/094911 A2 | | 11/2002 |
| WO | WO 2004/027115 A1 | | 4/2004 |
| WO | WO-2005/019336 A1 | | 3/2005 |

OTHER PUBLICATIONS

Krayden, Silane Coupling Agents, Dow Corning, 2009, pp. 1-7 (Year: 2009).*
Machine translation of JP2012046781A, published Mar. 2012. (Year: 2012).*

* cited by examiner

FLUORORESIN BASE MATERIAL, PRINTED WIRING BOARD, AND CIRCUIT MODULE

TECHNICAL FIELD

The present invention relates to a fluororesin base material, a printed wiring board, and a circuit module.

BACKGROUND ART

Printed wiring boards having fluororesin base materials are known. Such printed wiring boards having fluororesin base materials are used as circuit boards for high frequency signal processing, because fluororesins have a dielectric constant lower than that of epoxy resins. Furthermore, because fluororesins have excellent chemical resistance and heat resistance, the printed wiring boards having fluororesin base materials are also used as circuit boards exposed to chemicals or circuit boards in which heat resistance is demanded.

While fluororesins have chemical resistance, they have poor reactivity with other members, and thus, suffer from the problem of low adhesion strength (peel strength) to other members. In order to improve this problem, a fluororesin base material is surface-treated using various methods. An exemplary method of surface treatment is a plasma treatment. In the plasma treatment, the fluororesin base material is hydrophilized by plasma irradiation. In the manufacture of a printed wiring board using a fluororesin base material, it has been proposed to irradiate the fluororesin base material with plasma, and then form a metal layer on the fluororesin base material (see Japanese Patent Laying-Open No. 2003-201571 (PTD 1)).

CITATION LIST

Patent Document

PTD 1: Japanese Patent Laying-Open No. 2003-201571

SUMMARY OF INVENTION

Technical Problem

The plasma-treated fluororesin base material, however, is disadvantageous in that its surface-modified state is not maintained for a long time. Thus, after the surface modification, a predetermined treatment (for example, a treatment such as electroless plating) is performed within a predetermined period. Conventional fluororesin base materials thus require time and effort in terms of manufacturing control. Furthermore, because the portion where the metal layer is not formed loses its surface-modified state with time, a coating material having a sufficiently high adhesion strength (that is, peel strength) cannot be provided on the resulting circuit substrate. Hence, a fluororesin base material having a surface-modified state more stable than that of a conventional fluororesin base material is required.

The present invention was made in view of the foregoing circumstances, and an object of the invention is to provide a fluororesin base material having a stable surface-modified state, a printed wiring board having the fluororesin base material, and a circuit module.

Solution to Problem

A fluororesin base material according to one embodiment of the present invention is a fluororesin base material containing a fluororesin as a main component, the fluororesin base material including a modified layer on at least a partial region of a surface thereof, the modified layer containing a siloxane bond and a hydrophilic organofunctional group, and a surface of the modified layer having a contact angle of 90° or less with pure water.

Advantageous Effects of Invention

The fluororesin base material has a surface-modified state more stable than that of a conventional fluororesin base material.

DESCRIPTION OF EMBODIMENTS

Figure 1:
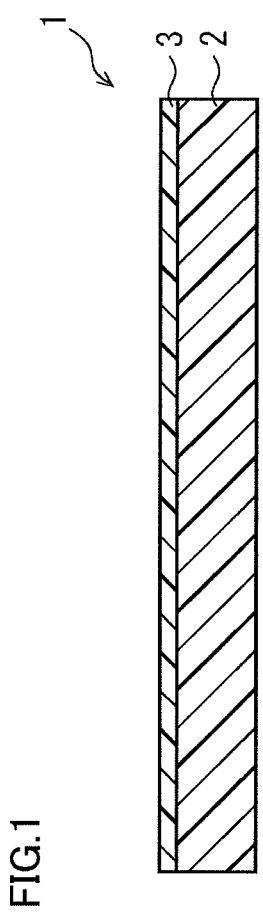
FIG. 1 is a cross-sectional view of a fluororesin base material.

Description of Embodiments of the Present Invention

A list of embodiments of the present invention will be described first.

A fluororesin base material according to one embodiment of the present invention is a fluororesin base material containing a fluororesin as a main component, the fluororesin base material including a modified layer on at least a partial region of a surface thereof, the modified layer containing a siloxane bond and a hydrophilic organofunctional group, and a surface of the modified layer having a contact angle of 900 or less with pure water.

The fluororesin base material is highly reactive on the hydrophilic surface of the modified layer whose contact angle with pure water is 90° or less. As used herein, the term "highly reactive" includes having significant physical action such as adhesiveness. The fluororesin base material is therefore surface active. Furthermore, because of its siloxane bond structure, this modified layer is stable over time, and therefore, its surface-modified state (surface active state) is more stable than that of a conventional fluororesin base material. As used herein, the term "fluororesin base material comprising a fluororesin as a main component" refers to a fluororesin base material having a fluororesin content of 50 mass % or more, and preferably 90 mass % or more. More preferably, the fluororesin base material additionally has an average fluororesin content of 95% or more in a depth position of 1 μm from the surface having at least the modified layer. As used herein, the term "hydrophilic organofunctional group" refers to a functional group having hydrophilicity and made up of a hydrogen atom and an atom higher in electronegativity than a hydrogen atom. As used herein, the term "contact angle with pure water" refers to a value of a contact angle measured using the sessile drop method under JIS-R-3257 (1999), for example, a value measured with a contact angle measuring apparatus such as "G-1-1000" from Erma Corporation. As used herein, the term "surface-modified state" means being more surface active than the original fluororesin base material. Specifically, by the surface-modified state is meant that at least one of the following is met: the contact angle of the surface with a polar solvent is smaller than that of the original fluororesin base material; the reactivity with chemical substances is higher than that of the original fluororesin base material; and the adhesiveness (peel strength) to resin is higher than that of the original fluororesin base material.

Preferably, a peel strength of an epoxy resin adhesive having an average thickness of 25 m against the surface of the modified layer is preferably 1.0 N/cm or more, as measured using a polyimide sheet having an average thickness of 12.5 μm as a flexible adherent. With this structure, an adhered material laminated on the surface of the polyimide sheet or the like can be resistant to peeling from the fluororesin base material. Note that the value of "peel strength" represents a value measured using the method in accordance with JIS-K-6854-2 (1999): "Adhesives—Determination of peel strength of adhered assemblies—Part 2: 180° peel". Note that in the measurement of peel strength above, a cover lay having a lamination of a polyimide sheet and an epoxy adhesive is used. As such a cover lay, one of cover lays of the "CM type" from Arisawa Manufacturing Co., Ltd. which uses "Apical (registered trademark) NPI" from Kaneka Corporation as the polyimide sheet is used.

Preferably, the modified layer is not removed by an etching treatment in which the modified layer is immersed under conditions of 45° C. and 2 minutes, using an etchant containing iron chloride and having a specific gravity of 1.33 $g/cm^3$ and a free hydrochloric acid concentration of 0.2 mol/L. With this structure, the surface-modified state (surface activity) of the fluororesin base material can be maintained even if the fluororesin base material on which a metal layer is formed is subjected to the etching treatment. Therefore, when the fluororesin base material is subjected to any of various treatments after the etching treatment, it can provide a satisfactory condition after the treatment.

Preferably, the surface of the modified layer has a mean surface roughness Ra of 4 μm or less. With this structure, satisfactory high frequency characteristics can be achieved when the fluororesin base material is used as a circuit board. Specifically, surface roughness Ra of a bonded surface of a conductive pattern laminated on the surface of the modified layer can be reduced. This reduces the unevenness of a portion where high frequency signals are concentrated due to the skin effect, allowing an electrical current to flow linearly, thus leading to a reduced transmission delay and transmission loss. As used herein, the term "mean surface roughness Ra" refers to an arithmetic mean roughness measured in accordance with JIS-B-0601 (2001).

Preferably, the modified layer has an average thickness of 400 nm or less. With this structure, when the fluororesin base material is used as a circuit board, deterioration of high frequency characteristics due to the thickness of the modified layer can be suppressed. Specifically, an increase in dielectric loss can be suppressed by designing the modified layer whose dielectric constant tends to increase to have an average thickness of 400 nm or less. Note that the "average thickness" of the modified layer is a distance measured with an interference thickness meter, XPS (X-ray Photoelectron Spectroscopy), an electron microscope, or the like.

In the fluororesin base material, preferably, the hydrophilic organofunctional group is a hydroxy group, a carboxy group, a carbonyl group, an amino group, an amide group, a sulfide group, a sulfonyl group, a sulfo group, a sulfonyldioxy group, an epoxy group, a methacryl group, a mercapto group, or a combination thereof. With this structure, the reactivity (including adhesion strength) of the surface of the fluororesin base material can be increased.

Preferably, the fluororesin base material has an optical transmittance at a wavelength of 600 nm of 50% or more. With this structure, the fluororesin base material can serve as an optical path of light. Note that the term "optical transmittance at a wavelength of 600 nm" refers to a value measured in accordance with JIS-K-7375 (2008), using a single-wavelength light source with a wavelength of 600 nm.

A printed wiring board according to one embodiment of the present invention includes the fluororesin base material described above. With this structure, the adhered material can be resistant to peeling in the printed wiring board. The adhered material means a material provided on the surface of the fluororesin base material, such as a metal layer, an adhesive, a coating material, or an ink. Specific examples of the adhered material may include a conductive adhesive, an anisotropic conductive adhesive, an adhesive for a cover lay film, a prepreg resin for bonding substrates together, a coating resin, solder resist, an electromagnetic shielding material, a heat conductive material, a reinforcing agent, an adhesive, a tackifier, an ink, a conductive paste, a conductive pattern, an adhesive for fixing and reinforcing a member, and a cover lay film.

Preferably, the printed wiring board includes a conductive pattern laminated on at least a portion of a region having the modified layer of the fluororesin base material. That is, the conductive pattern may be adhered to the fluororesin with the modified layer sandwiched therebetween. With this structure, peeling of the conductive pattern can be suppressed.

Preferably, the printed wiring board includes a coating material laminated on the surface of the modified layer of the fluororesin base material. With this structure, the peel strength of the coating material can be increased more than that when the coating material (for example, a cover lay film) is directly adhered to an unmodified fluororesin. Note that the coating material includes a covering resin and a coating member. The fluororesin base material having the above-described structure can also be adopted as the coating material. That is, the fluororesin as a low-dielectric material is adopted for both the fluororesin base material and the coating material. With this structure, a high frequency circuit module with a low signal transmission loss can be achieved.

A circuit module according to one embodiment of the present invention includes the printed wiring board described above. With this structure, peeling of the adhered material adhered to the printed wiring board can be suppressed, leading to higher reliability of the circuit module.

DETAILS OF EMBODIMENTS OF THE PRESENT INVENTION

Specific examples of the fluororesin base material, the printed wiring board, and the circuit module according to embodiments of the invention will be described below, with reference to the drawings.

[Fluororesin Base Material]

Referring to FIG. 1, a fluororesin base material 1 will be described. Fluororesin base material 1 includes a fluororesin layer 2 containing a fluororesin as a main component, and a modified layer 3 formed on at least a partial region of the surface of fluororesin layer 2. Note that the "surface" of fluororesin layer 2 refers to the entire peripheral surface of fluororesin layer 2, including one surface of fluororesin layer 2 and another surface opposite to that surface. Although FIG. 1 shows modified layer 3 formed on all of one surface, this is merely illustrative, and the region on which modified layer 3 is formed may be a portion of one surface, or may be all of both surfaces or a portion of each of both surfaces.

As used herein, the term "fluororesin" refers to a fluororesin in which at least one of hydrogen atoms bonded to carbon atoms forming the repeating unit of the polymer chain has been substituted with a fluorine atom or an organic group having a fluorine atom (hereinafter also referred to as a "fluorine atom-containing group"). The fluorine atom-containing group is a group in which at least one of hydrogen atoms in a straight or branched chain organic group has been substituted with a fluorine atom, and examples may include a fluoroalkyl group, a fluoroalkoxy group, and a fluoropolyether group.

The term "fluoroalkyl group" means an alkyl group in which at least one hydrogen atom has been substituted with a fluorine atom, and includes a "perfluoroalkyl group". Specifically, the "fluoroalkyl group" includes a group in which all of the hydrogen atoms in an alkyl group have been substituted with fluorine atoms; a group in which all of hydrogen atoms except for one terminal hydrogen atom of an alkyl group have been substituted with fluorine atoms; etc.

The term "fluoroalkoxy group" means an alkoxy group in which at least one hydrogen atom has been substituted with a fluorine atom, and includes a "perfluoroalkoxy group". Specifically, the "fluoroalkoxy group" includes a group in which all of the hydrogen atoms in an alkoxy group have been substituted with fluorine atoms; a group in which all of hydrogen atoms except for one terminal hydrogen atom of an alkoxy group have been substituted with fluorine atoms; etc.

The term "fluoropolyether group" means a monovalent group having an oxyalkylene unit as a repeating unit and having a terminal alkyl group or hydrogen atom, in which at least one hydrogen atom of the alkylene oxide chain or the terminal alkyl group has been substituted with a fluorine atom. The term "fluoropolyether group" includes a "perfluoropolyether group" having a plurality of perfluoroalkylene oxide chains as a repeating unit.

Examples of unmodified fluororesin base material 1, that is, the fluororesin used as the main component of fluororesin layer 2, may include polytetrafluoroethylene (PTFE), polytetrafluoroethylene-perfluoroalkylvinylether copolymer (PFA), tetrafluoroethylene-hexafluoropropylene copolymer (FEP), tetrafluoroethylene-ethylene copolymer (ETFE), polyvinylidene fluoride (PVDF), polychlorotrifluoroethylene (PCTFE), chlorotrifluoroethylene-ethylene copolymer (ECTFE), polyvinyl fluoride (PVF), as well as a thermoplastic fluororesin (THV) and a fluoroelastomer formed of the three monomers of tetrafluoroethylene, hexafluoropropylene, and vinylidene fluoride. A mixture or copolymer containing these compounds can also be used as the material forming fluororesin base material 1.

Particularly preferable as the fluororesin used as the main component of fluororesin layer 2 are tetrafluoroethylene-hexafluoropropylene copolymer (FEP), polytetrafluoroethylene-perfluoroalkylvinylether copolymer (PFA), and polytetrafluoroethylene (PTFE). The use of these fluororesins provides fluororesin layer 2 with flexibility, optical transparency, heat resistance, and flame retardancy.

Fluororesin layer 2 can also contain, as optional component(s), an engineering plastic, a flame retardant, a flame retardant aid, a pigment, an antioxidant, a reflection imparting agent, a masking agent, a lubricant, a processing stabilizer, a plasticizer, a foaming agent, and/or a reinforcing material, for example.

The engineering plastic to be used can be selected from known engineering plastics based on the characteristics required in fluororesin base material 1. Typically, an aromatic polyether ketone can be used as the engineering plastic.

The aromatic polyether ketone is a thermoplastic resin having a structure in which the benzene rings are attached at the para-positions and linked with each other through a rigid ketone bond (—C(=O)—) or a flexible ether bond (—O—). Examples of the aromatic polyether ketone may include polyetheretherketone (PEEK) having a structural unit in which an ether bond, a benzene ring, an ether bond, a benzene ring, a ketone bond, and a benzene ring are aligned in this order, and polyether ketone (PEK) having a repeating unit in which an ether bond, a benzene ring, a ketone bond, and a benzene ring are aligned in this order. PEEK is particularly preferable as the aromatic polyether ketone. These aromatic polyether ketones have excellent wear resistance, heat resistance, insulating properties, workability, etc.

A commercially available product can be used as the aromatic polyether ketone such as PEEK. Aromatic polyether ketones of various grades are available in the market, and a commercially available aromatic polyether ketone may be used alone, or aromatic polyether ketones of a plurality of grades may be used in combination, or a modified aromatic polyether ketone may be used.

As the flame retardant, any of various known flame retardants can be used, such as, for example, a halogenated flame retardant such as a brominated flame retardant or a chlorinated flame retardant.

As the flame retardant aid, any of various known flame retardant aids can be used, such as, for example, antimony trioxide.

As the pigment, any of various known pigments can be used, such as, for example, titanium oxide.

As the antioxidant, any of various known antioxidants can be used, such as, for example, a phenolic antioxidant.

As the reflection imparting agent, any of various known reflection imparting agents can be used, such as, for example, titanium oxide.

Although the reinforcing material is not particularly limited as long as it has a linear expansion coefficient lower than that of fluororesin layer 2, the reinforcing material desirably has an insulating property, heat resistance such that it does not melt and flow at the melting point of the fluororesin, a tensile strength equal to or higher than that of the fluororesin, and corrosion resistance. This reinforcing material can be composed of, for example, glass cloth obtained by forming a glass into a cloth; fluororesin-containing glass cloth obtained by impregnating such glass cloth with a fluororesin; resin cloth obtained by forming a heat-resistant fiber such as a metal, a ceramic, alumina, polytetrafluoroethylene (PTFE), polyetheretherketone (PEEK), a polyimide (PI), or aramid into a cloth or a nonwoven fabric; or a heat-resistant film containing, as a main component, polytetrafluoroethylene (PTFE), a liquid crystal polymer (LCP (I type)), a polyimide, polyamidoimide (PAI), polybenzimidazole (PBI), polyetheretherketone, polytetrafluoroethylene, tetrafluoroethylene-perfluoro alkyl vinyl ether copolymer (PFA), a thermosetting resin, a crosslinkable resin, or the like. Note that the above-described resin cloth or heat-resistant film to be used has a melting point (or a heat deflection temperature) not lower than a temperature of thermocompression bonding in a step of forming the modified layer described below. The cloth is preferably plainwoven to make fluororesin base material 1 thin, while it is preferably twill-woven or satin-woven to make fluororesin base material 1 flexible. Other known weaves are also applicable.

Fluororesin base material 1 may be provided with a hollow structure.

A lower limit of the average thickness of fluororesin base material 1 is preferably 3 µm, and more preferably 6 µm. On the other hand, an upper limit of the average thickness of fluororesin base material 1 is preferably 1 mm, more preferably 0.5 mm, still more preferably 0.1 mm, and particularly preferably 55 µm. If the average thickness of fluororesin base material 1 falls below the lower limit, the strength of fluororesin base material 1 may become insufficient. On the other hand, if the average thickness of fluororesin base material 1 exceeds the upper limit, the flexibility and the optical transparency of fluororesin base material 1 and thus, of a printed wiring board including fluororesin base material 1, may become insufficient.

A lower limit of the optical transmittance at a wavelength of 600 nm of fluororesin base material 1 is preferably 50%, and more preferably 70%. On the other hand, while an upper limit of the optical transmittance of fluororesin base material 1 is not particularly limited, theoretically, it does not exceed 100%. If the light transparency falls below the lower limit, fluororesin base material 1 may not be usable for applications requiring transparency. Examples of such applications requiring transparency may include a printed circuit board for an electrical circuit having a light emitting element that projects light or a light receiving element that receives light, through fluororesin base material 1; a hybrid circuit board including both an optical circuit and an electrical circuit; and a transparent conductive film used for, for example, a flat display panel, a touch panel, or the like including an organic EL, a liquid crystal, or the like.

<Modified Layer>

Modified layer 3 contains a siloxane bond (Si—O—Si) and a hydrophilic organofunctional group. Modified layer 3 is formed by causing a modifier (silane coupling agent) having a hydrophilic organofunctional group and producing a siloxane bond to be bonded to the fluororesin as the main component of fluororesin layer 2. That is, in modified layer 3, the hydrophilic organofunctional group is bonded to a Si atom forming the siloxane bond. This hydrophilic organofunctional group imparts wettability to the surface side of fluororesin base material 1. Note that the chemical bond between the fluororesin and the modifier may be formed of a covalent bond alone, or may contain a covalent bond and a hydrogen bond. Modified layer 3 is a region believed to differ from a region (near a surface of fluororesin layer 2) excluding modified layer 3 near the surface of fluororesin base material 1, in terms of microstructure, molecular structure, and abundance ratio of elements. The hydrophilic organofunctional group contained in modified layer 3 makes fluororesin base material 1 hydrophilic, which improves the wettability of the surface. Thus, when fluororesin base material 1 is surface-treated in a polar solvent, the uniformity of the treatment rate and the surface treatment (evenness of the treatment) can be improved.

In modified layer 3, a Si atom forming the siloxane bond (this atom is hereinafter referred to as the "Si atom of the siloxane bond") is covalently bonded to a C atom of fluororesin layer 2 via at least one atom of any of N, C, O, and S atoms. For example, the Si atom of the siloxane bond is bonded to the C atom of the fluororesin via an atomic group such as —O—, —S—, —S—S—, —(CH$_2$)n-, —NH—, —(CH$_2$)n-NH—, or —(CH$_2$)n-O—(CH$_2$)m- (where each of n and m is an integer of 1 or more).

Preferable as the hydrophilic organofunctional group are a hydroxy group, a carboxy group, a carbonyl group, an amino group, an amide group, a sulfide group, a sulfonyl group, a sulfo group, a sulfonyldioxy group, an epoxy group, a methacryl group, and a mercapto group. Among these, a group containing a N atom or a S atom is more preferable. These hydrophilic organofunctional groups improve the adherence of the surface of fluororesin base material 1. Note that modified layer 3 may contain two or more types of these hydrophilic organofunctional groups. By thus providing modified layer 3 with hydrophilic organofunctional groups exhibiting different properties, the reactivity or the like of the surface of fluororesin base material 1 can be diversified. Any of these hydrophilic organofunctional groups is bonded to a Si atom as a constituent of the siloxane bond, either directly or via one or more C atoms (for example, a methylene or phenylene group).

As the modifier for forming modified layer 3 having the above-described characteristics, a silane coupling agent having a hydrophilic organofunctional group in the molecule is suitable, and in particular, a silane coupling agent having a hydrolyzable silicon-containing functional group containing a Si atom is more suitable. Such a silane coupling agent is chemically bonded to the fluororesin forming fluororesin layer 2. The chemical bond between the silane coupling agent and the fluororesin of fluororesin layer 2 may be formed of a covalent bond alone, or may contain a covalent bond and a hydrogen bond. As used herein, the term "hydrolyzable silicon-containing functional group" refers to a group that can form a silanol group (Si—OH) through hydrolysis.

An upper limit of the contact angle of the surface of modified layer 3 with pure water is 90°, preferably 80°, and more preferably 70°. If the contact angle of the surface of modified layer 3 with pure water exceeds the upper limit, the adhesion strength to the adhered material such as the conductive pattern or the like may become insufficient. On the other hand, a lower limit of the contact angle of the surface of modified layer 3 with pure water is not particularly limited.

Preferably, modified layer 3 has etching resistance such that modified layer 3 is not removed by an etching treatment in which it is immersed under conditions of 45° C. and 2 minutes, using an etchant containing iron chloride and having a specific gravity of 1.33 g/cm$^3$ and a free hydrochloric acid concentration of 0.2 mol/L. As used herein, the term "modified layer 3 is not removed" means that the hydrophilicity is not lost, and the contact angle of pure water on the portion where modified layer 3 is formed does not exceed 90°. Note that although the etching treatment may sometimes unevenly produce hydrophobic minute portions in the region where modified layer 3 is formed, if the entire region has hydrophilicity, hydrophilicity is maintained in this state.

Preferably, modified layer 3 has etching resistance against an etchant containing copper chloride. Note that it has been ascertained that when modified layer 3 has the above-described etching resistance against the etchant containing iron chloride, modified layer 3 has the above-described etching resistance against an etchant containing copper chloride.

A lower limit of an adhesion energy between the surface of modified layer 3 and water is preferably 50 dyne/cm. If the adhesion energy between the surface of modified layer 3 and water falls below the lower limit, the adherence of the surface of fluororesin base material 1 may become insufficient compared to that of pure polytetrafluoroethylene (PTFE).

A lower limit of wetting tension of the surface of modified layer 3 is preferably 50 mN/m, and more preferably 60 mN/m. If the wetting tension is less than the lower limit, the adhesive force may become insufficient, which may cause the adhered material to be peeled off from modified layer 3. The surface of modified layer 3 has improved adherence because the lower limit of the wetting tension described above is greater than the wetting tension of pure polytetrafluoroethylene (PTFE). In contrast, if the wetting tension of the surface of modified layer 3 falls below the lower limit, the adherence of the surface of modified layer 3 may become insufficient. Note that the term "wetting tension" is a value measured in accordance with JIS-K-6768 (1999).

An upper limit of the average thickness of modified layer 3 is preferably 400 nm, and more preferably 200 nm. If the average thickness of modified layer 3 exceeds the upper limit, the dielectric loss may increase in applications where fluororesin base material 1 is used as a circuit board, leading to insufficient high frequency characteristics.

A lower limit of the peel strength of the epoxy resin adhesive having an average thickness of 25 μm against the surface of modified layer 3 is preferably 1.0 N/cm, more preferably 3.0 N/cm, and still more preferably 5.0 N/cm, as measured using a polyimide sheet having an average thickness of 12.5 μm as a flexible adherent. If the peel strength of the epoxy resin adhesive against the surface of modified layer 3 falls below the lower limit, peeling of the adhered material such as a cover lay adhered to the surface of fluororesin base material 1 cannot be prevented, and thus, reliability required in a circuit module including fluororesin base material 1 may not be achieved.

An upper limit of mean surface roughness Ra of the surface of modified layer 3 is preferably 4 μm, more preferably 2 μm, and still more preferably 1 μm. If mean surface roughness Ra of the surface of modified layer 3 exceeds the upper limit, when a conductive pattern is laminated on the surface of modified layer 3, a rear surface of the conductive pattern may become uneven, and an electrical current may flow along this uneven portion due to the skin effect. This may lead to an increased transmission delay and transmission loss of high frequency characteristic signals, and may lead to increased scattering of light and thus, reduced transparency of fluororesin base material 1.

Fluororesin base material 1 having the above-described structure is used as an insulating layer of a printed wiring board, for example. In this case, as the adhered material, a coating member, a covering resin, an adhesive, an ink, or the like is laminated on fluororesin base material 1. The coating member may be a cover lay film, for example. A cover lay is generally formed of a base material made of a resin film, and an adhesive layer that is laminated on the base material and to be adhered to fluororesin base material 1. The base material of such a cover lay is formed of, for example, a polyimide, an epoxy resin, SPS, a fluororesin, a crosslinkable polyolefin, or a silicone.

Examples of the adhesive adhered to fluororesin base material 1 may include a conductive adhesive, an anisotropic conductive adhesive, an adhesive for a cover lay film, and a prepreg resin for bonding substrates together. Examples of resins for use as a main component of such an adhesive may include an epoxy resin, a polyimide, an unsaturated polyester, a saturated polyester, a butadiene resin, an acrylic resin, a polyamide, a polyolefin, a silicone, a fluororesin, an urethane resin, polyetheretherketone (PEEK), polyamidoimide (PAI), polyethersulfone (PES), syndiotactic polystyrene (SPS), and a resin containing one or more of the above. A resin obtained by crosslinking any of these resins using an electron beam, a radical reaction, or the like may also be used as the material of the adhesive.

Fluororesin base material 1 having the above-described structure can also be used as a cover lay film of another printed wiring board. For example, fluororesin base material 1 having the above-described structure can be used as a cover lay film for a printed wiring board having fluororesin base material 1 as an insulating layer. That is, the low dielectric material is adopted for both the insulating layer and the coating material. With this structure, a high frequency circuit module with a low signal transmission loss can be achieved. Note that in this case, because the insulating layer and the cover lay film are both made of the fluororesin, they can be adhered to each other by thermal fusion, without using an adhesive. This pressing is performed under conditions of not lower than 180° C. and not higher than 400° C., not shorter than 20 minutes and not longer than 30 minutes, and not lower than 3 MPa and not higher than 4 MPa.

Fluororesin base material 1 can also be adopted as a cover lay film for a printed wiring board having a polyimide or a liquid crystal polymer as an insulating layer. In this case, the printed wiring board and fluororesin base material 1 are adhered to each other with an adhesive sandwiched therebetween. Note that because fluororesin base material 1 includes modified layer 3, with this side serving as the surface to be adhered, fluororesin base material 1 and the printed wiring board can be bonded to each other with an existing adhesive (for example, an epoxy resin).

[Printed Wiring Board]

Figure 2:
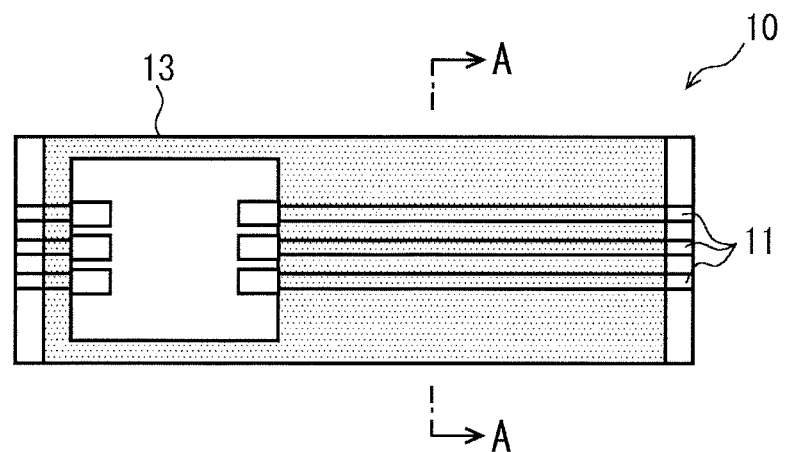
FIG. 2 is a plan view of a printed wiring board.
Figure 3:
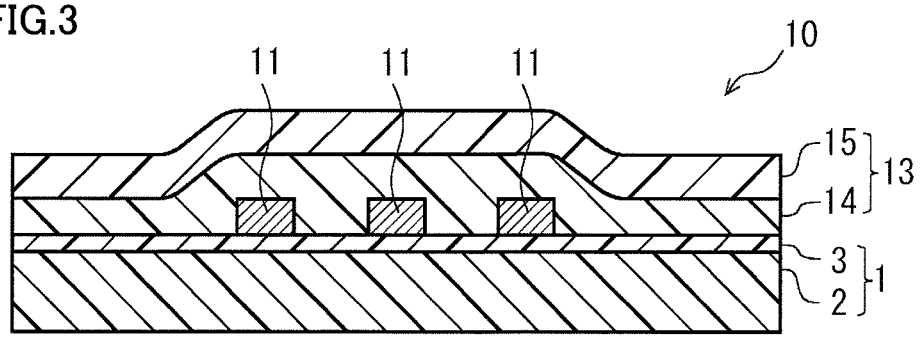
FIG. 3 is a cross-sectional view along line A-A in FIG. 2.

Referring to FIGS. 2 and 3, a printed wiring board 10 according to one embodiment of the present invention will be described.

Printed wiring board 10 includes fluororesin base material 1 having the above-described structure, and a conductive pattern 11 formed on at least one surface of fluororesin base material 1. Conductive pattern 11 is formed on at least a partial region of fluororesin base material 1. Conductive pattern 11 is at least partially covered with a coating material 13. Note that coating material 13 may not be provided, depending on the application of printed wiring board 10.

Preferably, modified layer 3 is formed to include a region having conductive pattern 11 and coating material 13 in fluororesin base material 1. That is, preferably, conductive pattern 11 is provided on modified layer 3, and coating material 13 is provided on modified layer 3. With this structure, the peel strength of conductive pattern 11 and coating material 13 is improved.

Conductive pattern 11 is formed of, for example, copper, silver, gold, SUS (stainless steel), iron, aluminum, nickel, or ITO (Indium Tin Oxide). Conductive pattern 11 may also be formed of a conductive resin or conductive adhesive, which is a mixture of a resin and a metal powder. Note that conductive pattern 11 includes a land, a ground pattern, an electrode, a metal reinforcing layer, a dummy layer, and the like.

Coating material 13 includes a coating member such as a cover lay film, and a covering resin having fluidity when uncured. Examples of the covering resin may include a coating resin, solder resist, a conductive adhesive, an electromagnetic shielding material, a heat conductive material, a reinforcing agent, an adhesive, a tackifier, an adhesive for a cover lay film, an ink, and a conductive paste. Examples of materials of these covering resins may include an epoxy resin, a polyimide, an unsaturated polyester, a saturated polyester, a butadiene resin, an acrylic resin, a polyamide, a polyolefin, a silicone, a fluororesin, an urethane resin, polyetheretherketone, polyamidoimide, polyethersulfone, syndiotactic polystyrene, a styrene-based resin, modified polyphenylene ether (m-PPE), and a resin containing two or more of the above. Among the above, a resin obtained by mixing a styrene-based resin and modified polyphenylene ether is preferable because of its low dielectric constant and ease of adhesion. Moreover, a resin obtained by crosslinking any of these resins using an electron beam, a radical reaction, or the like may also be used as the material of the covering resin. Furthermore, a resin obtained by including voids or bubbles (vacancies) in any of these resins may also be used as the material of the covering resin.

Note that as the resin forming the coating member, a resin having high adhesiveness to the fluororesin forming fluororesin base material 1 is preferable among the resins mentioned above. Examples of this resin may include a fluororesin, polyetheretherketone, polyamidoimide, polyethersulfone, an epoxy resin, an acrylic resin, a polyamide, an urethane resin, a styrene-based resin, and modified polyphenylene ether.

Note that the dielectric constant E can be set to 3 or less in coating material 13 formed of a fluororesin, a crosslinkable polyolefin, a styrene-based resin such as syndiotactic polystyrene, or modified polyphenylene ether, or coating material 13 having voids or bubbles (vacancies) in any of the above. Coating material 13 having this structure is therefore suitable as a member requiring a low dielectric loss (for example, a member for high frequency use).

FIG. 3 is a cross-sectional view along A-A in FIG. 2 of printed wiring board 10. A cover lay film as coating material 13 includes an adhesive layer 14 and a protective layer 15. Conductive pattern 11 is formed on modified layer 3. Adhesive layer 14 of the cover lay film is adhered to modified layer 3. This allows the cover lay film to be resistant to peeling.

Figure 4:
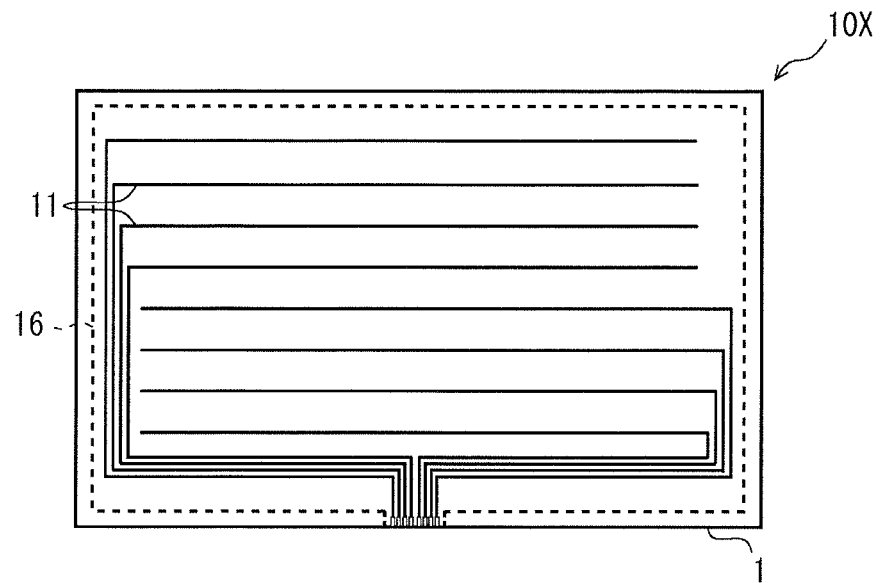
FIG. 4 is a plan view showing another example of the printed wiring board.

FIG. 4 illustrates another example of the printed wiring board. A printed wiring board 10X includes fluororesin base material 1 described above. Modified layer 3 is formed on one surface of printed wiring board 10X. That is, the one surface is made hydrophilic. Conductive pattern 11 is also formed on the surface on which modified layer 3 is formed. At least a central is transparent, and mean surface roughness Ra of central portion 16 is formed to be 4 μm or less. Printed wiring board 10X is used as an electrode sheet for a touch panel, for example. Note that modified layer 3 may be formed on all of, or one or more partial regions of, the other surface of printed wiring board 10X. In this way, in a manufacturing process using printed wiring board 10X, when printed wiring board 10X is transferred on a transfer plate, printed wiring board 10X is adsorbed onto the transfer plate by virtue of the function of modified layer 3 formed on the other surface. This suppresses slippage of printed wiring board 10X during transfer.

[Circuit Module]

Figure 5:
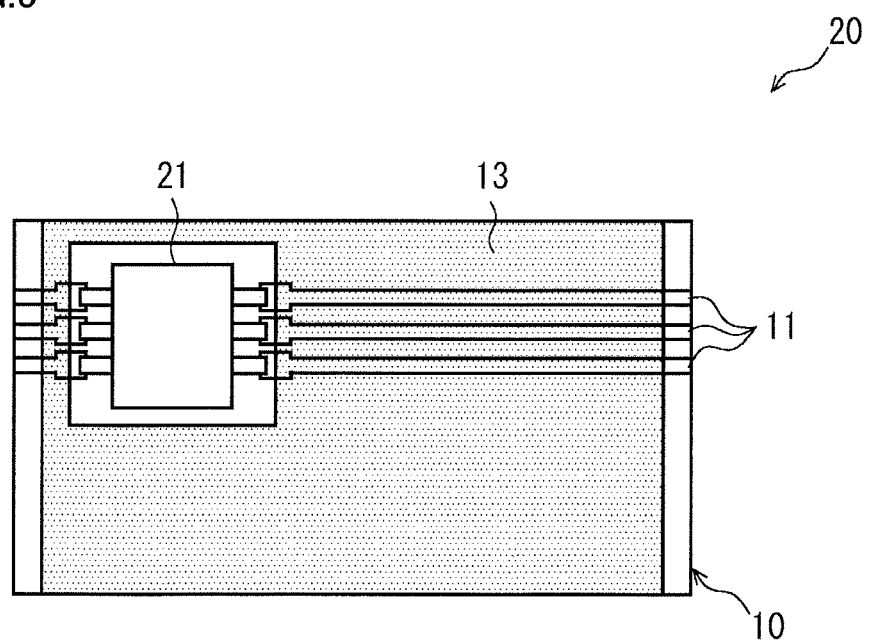
FIG. 5 is a schematic diagram of a circuit module.

Referring to FIG. 5, circuit module 20 will be described. Circuit module 20 includes printed wiring board 10 described above, and an electronic component 21 mounted on printed wiring board 10. Conductive pattern 11 connected to electronic component 21 is covered with coating material 13 such as solder resist or a cover lay film. Examples of electronic component 21 may include a resistor, a capacitor, a coil, a connector, a switch, an IC (Integrated Circuit), a light emitting element, a light receiving element, an acceleration sensor, an acoustic device (a piezoelectric element, a silicon microphone, or the like), a magnetic sensor, a temperature sensor, and a coaxial cable.

Circuit module 20 is superior in manufacturability to a circuit module having a conventional fluororesin base material, in that printed wiring board 10 described above includes fluororesin base material 1 having heat resistance that withstands reflow, and having modified layer 3 with high adhesiveness. Circuit module 20 has also excellent heat resistance because it has fluororesin base material 1 with high heat resistance.

[High Frequency Circuit Module]

A high frequency circuit module will be described. The high frequency circuit module includes printed wiring board 10 described above, and a high frequency device (a kind of electronic component 21) mounted on printed wiring board 10. Conductive pattern 11 connected to electronic component 21 is covered with coating material 13 such as solder resist or a cover lay film.

This high frequency circuit module, which includes fluororesin base material 1 having a low dielectric constant, provides a reduced signal transmission loss of high frequency signals, compared to a high frequency circuit module having an epoxy resin base material. Moreover, conductive pattern 11 and solder resist are provided on modified layer 3. This makes conductive pattern 11 and solder resist resistant to peeling from fluororesin base material 1 even in a high temperature, high humidity environment. This suppresses disconnection due to peeling of conductive pattern 11, or deterioration of circuit characteristics due to peeling of the solder resist, even in a high temperature, high humidity environment. Consequently, deterioration of the characteristics of the high frequency circuit module can be reduced, compared with a high frequency circuit module having a conventional fluororesin base material without modified layer 3.

[Method for Manufacturing the Fluororesin Base Material]

Figure 6:
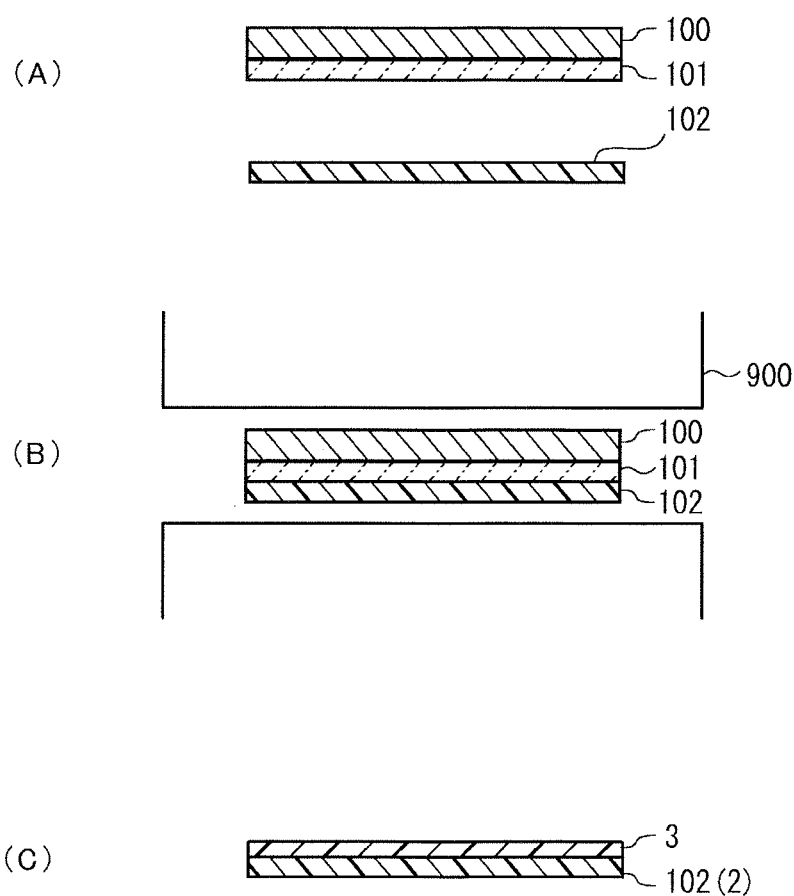
FIG. 6 is a schematic diagram showing a method for manufacturing the fluororesin base material.

Referring to FIG. 6, a method for manufacturing fluororesin base material 1 will be described. In a first step, a primer material 101 containing a silane coupling agent as the modifier, an alcohol, and water is adhered to a flat plate-like carrier 100 (see FIG. 6(A)). Note that a region of a surface of carrier 100 to which primer material 101 is to be adhered is at least a portion of the surface of carrier 100, and primer material 101 may be adhered to the entire surface of carrier 100. Primer material 101 may be adhered to only one surface of carrier 100, or only a partial region of one surface of carrier 100. Note that the entire surface of carrier 100 herein means the entire outer peripheral surface. For example, when carrier 100 is a sheet, the entire surface of carrier 100 means all of the opposite surfaces, and when carrier 100 is rectangular, it means all of the six surfaces.

Primer material 101 may be adhered to carrier 100 using any non-limiting method. For example, any of an immersion method, a spraying method, a coating method, and the like may be adopted. The alcohol in primer material 101 is then removed by drying. The alcohol may be removed using any of natural drying, heat drying, and drying under reduced pressure. Note that drying may be continuously performed in a press machine 900 that performs thermocompression bonding in a second step. After drying, the silane coupling agent is bonded to carrier 100 by heating (at 120° C. for 15 minutes, for example).

A lower limit of the content of the silane coupling agent in the entire primer material 101 is preferably 0.1 mass %, and more preferably 0.5 mass %. On the other hand, an upper limit of the content of the silane coupling agent in the entire primer material 101 is preferably 5 mass %, and more preferably 3 mass %. If the content of the silane coupling agent exceeds the upper limit, aggregation of the silane coupling agent may occur, and a film of primer material 101 with a uniform thickness may not be easily formed on the surface of carrier 100.

As the silane coupling agent, a silane coupling agent having a hydrophilic organofunctional group containing a N atom or a S atom and having a hydrolyzable silicon-containing functional group containing a Si atom is suitably used.

The hydrolyzable silicon-containing functional group containing a Si atom of the silane coupling agent produces a silanol group through hydrolysis. Further, condensation of these silanol groups forms a siloxane bond (Si—O—Si). Moreover, some of the silanol groups and the hydrophilic organofunctional groups are bonded to carrier 100. As a result, a coating containing siloxane bonds that ensure stability and the hydrophilic organofunctional groups that ensure hydrophilicity is formed on carrier 100. Furthermore, the hydrophilic organofunctional group, which contains a N atom or a S atom, can be relatively easily bonded to the fluororesin of fluororesin layer 2.

The above-described hydrolyzable silicon-containing functional group containing a Si atom is specifically a group in which an alkoxy group is bonded to the Si atom. Examples of the alkoxy group may include a methoxy group, an ethoxy group, a propoxy group, a t-butoxy group, and a pentyloxy group.

Examples of the hydrophilic organofunctional group containing a N atom may include an amino group and an ureido group.

Examples of silane coupling agents having the hydrophilic organofunctional group containing a N atom may include an aminoalkoxysilane, an ureidoalkoxysilane, and derivatives thereof.

Examples of the aminoalkoxysilane may include 3-aminopropyltrimethoxysilane, 3-aminopropyltriethoxysilane, N-(2-aminoethyl)-3-aminopropylmethyldimethoxysilane, N-(2-aminoethyl)-3-aminopropyltrimethoxysilane, N-(2-aminoethyl)-3-aminopropyltriethoxysilane, and N-phenyl-3-aminopropyltrimethoxysilane.

Examples of derivatives of the aminoalkoxysilane may include a ketimine such as 3-triethoxysilyl-N-(1,3-dimethylbutylidene)propylamine, and a salt of a silane coupling agent such as N-vinylbenzyl-2-aminoethyl-3-aminopropyltrimethoxysilane acetate.

Examples of the ureidoalkoxysilane may include 3-ureidopropyltriethoxysilane, 3-ureidopropyltrimethoxysilane, and N-(2-ureidoethyl)-3-aminopropyltrimethoxysilane.

Examples of the hydrophilic organofunctional group containing a S atom may include a mercapto group and a sulfide group.

Examples of silane coupling agents having the hydrophilic organofunctional group containing a S atom may include mercaptoalkoxysilane, sulfidealkoxysilane, and derivatives thereof.

Examples of the mercaptoalkoxysilane may include 3-mercaptopropyltrimethoxysilane, 3-mercaptopropyltriethoxysilane, and 3-mercaptopropyl(dimethoxy)methylsilane.

Examples of sulfidealkoxysilane my include bis(3-triethoxysilylpropyl)tetrasulfide and bis(3-triethoxysilylpropyl)disulfide.

A silane coupling agent obtained by introducing a modifier group to any of the above-described silane coupling agents may also be used. A phenyl group is preferable as the modifier group.

Among those described above as examples, preferable as the silane coupling agent is 3-aminopropyltriethoxysilane, N-phenyl-3-aminopropyltrimethoxysilane, 3-ureidopropyltriethoxysilane, 3-mercaptopropyltrimethoxysilane, or bis(3-triethoxysilylpropyl)tetrasulfide.

In combination with the silane coupling agent described above, another coupling agent can be used as a modifier. Any coupling agent that is reactive with the fluororesin of fluororesin layer 2 or radicals thereof may be used as the other coupling agent, such as, for example, a titanium-based coupling agent.

Examples of the titanium-based coupling agent may include isopropyltriisostearoyl titanate, isopropyltristearoyl titanate, isopropyltrioctanoyl titanate, isopropyldimethacrylisostearoyl titanate, isopropyltridodecylbenzenesulfonyl titanate, isopropylisostearoyldiacryl titanate, isopropyltri(dioctylphosphate)titanate, isopropyltricumylphenyl titanate, isopropyltris(dioctylpyrophosphate)titanate, isopropyltri(N-aminoethyl-aminoethyl)titanate, tetraisopropylbis (dioctylphosphite)titanate, tetraoctylbis(ditridecylphosphite)titanate, tetra(2,2-diallyloxymethyl-1-butyl)bis (ditridecylphosphite)titanate, dicumylphenyloxyacetate titanate, bis(dioctylpyrophosphate)oxyacetate titanate, diisostearoyl ethylene titanate, bis(dioctylpyrophosphate) ethylene titanate, bis(dioctylpyrophosphate)diisopropyl titanate, tetramethyl orthotitanate, tetraethyl orthotitanate, tetrapropyl orthotitanate, tetraisopropyltetraethyl orthotitanate, tetrabutyl orthotitanate, butylpolytitanate, tetraisobutyl orthotitanate, 2-ethylhexyl titanate, stearyl titanate, cresyl titanate monomer, cresyl titanate polymer, diisopropoxy-bis (2,4-pentadionate)titanium (IV), diisopropyl-bis(triethanolamino)titanate, octylene glycol titanate, titanium lactate, acetoacetic ester titanate, diisopropoxybis(acetylacetonato) titanium, di-n-butoxybis(triethanolaminato)titanium, dihydroxybis(lactato)titanium, titanium-isopropoxyoctyleneglycolate, tetra-n-butoxytitanium polymer, tri-n-butoxytitanium monostearate polymer, butyl titanate dimer, titanium acetylacetonate, poly(titanium acetylacetonate), titanium octylene glycolate, titanium lactate ammonium salt, titanium lactate ethyl ester, titanium triethanol aminate, and polyhydroxy titanium stearate.

Examples of the alcohol contained in primer material 101 may include methanol, ethanol, n-propanol, n-butanol, tert-butanol, and isopropyl alcohol. A solution containing one or more selected from the group consisting of these alcohols is used as a solvent of primer material 101.

Water in primer material 101, which may be used in a very small amount, is essential for the condensation of the silane coupling agent. The proportion of water is set to, for example, not less than 0.01 mass % and not more than 0.1 mass %, based on the total amount of the alcohol.

An organic substance is used as carrier 100. For example, carrier 100 is formed of a metal such as copper, gold, silver, iron, aluminum, or nickel, or a material such as a glass, silicon, a silicone, carbon, or a ceramic. Carrier 100 may also be a composite of these materials.

When a dissolution method (see below) is adopted for stripping carrier 100, a base metal that dissolves in an etchant is adopted as carrier 100. For example, a metal sheet such as copper, iron, or aluminum is used as carrier 100 of primer material 101. As used herein, the term "base metal" refers to a metal having an ionization tendency equal to or higher than that of copper, and specifically, a metal having a standard redox potential of 0.5 V or less.

While the shape of carrier 100 is not particularly limited, it is configured to match the shape of the object on which modified layer 3 is to be formed. For example, when modified layer 3 is to be formed on plate- or sheet-like fluororesin material 102, plate-like carrier 100 is used. Moreover, when modified layer 3 is to be formed on fluororesin material 102 having a curved surface, carrier 100 shaped to conform to the curved surface is used. Carrier 100 may also be segmented into a plurality of block regions when seen in a plan view.

Preferably, mean surface roughness Ra of a portion of carrier 100 to which primer material 101 is adhered (hereinafter referred to as the "adhered surface") is set to be not more than a predetermined value. Specifically, an upper limit of mean surface roughness Ra of the adhered surface of carrier 100 is preferably 4 μm, and more preferably 1 μm. If mean surface roughness Ra of the adhered surface of carrier 100 exceeds the upper limit, mean surface roughness Ra of modified layer 3 may become high. It is also desirable to adjust the adhered surface of carrier 100 to achieve a surface on which a liquid primer material can be uniformly applied. In particular, the adhered surface of carrier 100 advantageously has good wettability, and desirably has a contact angle of 100° or less with water.

Note that mean surface roughness Ra of a predetermined region of the entire adhered surface of carrier 100 may be set to not more than a predetermined value, and mean surface roughness Ra of a peripheral portion of the predetermined region may be set to be higher than the predetermined value. In this case, the surface roughness of modified layer 3 of the portion corresponding to the predetermined region can be made lower than the surface roughness of the peripheral portion thereof.

In the second step, fluororesin material 102 is laminated onto the surface of carrier 100 on which the primer material is adhered, with primer material 101 sandwiched therebetween, and the resulting laminate is subjected to thermocompression bonding with press machine 900 (see FIG. 6(B)). Thermocompression bonding is preferably performed under reduced pressure, in order to prevent bubbles or voids from being formed between carrier 100 and fluororesin material 102. Thermocompression bonding is also preferably performed under low oxygen conditions, in order to suppress oxidation of carrier 100. For example, thermocompression bonding is performed in a nitrogen atmosphere. In this way, modified layer 3 is formed between carrier 100 and fluororesin material 102.

Fluororesin material 102 is a member forming fluororesin layer 2 of fluororesin base material 1. Depending on the application of fluororesin base material 1, fluororesin material 102 containing any of various additives (filler) is used. When a bending strength is required in fluororesin base material 1, fluororesin material 102 containing the above-described reinforcing material such as glass cloth is used.

Preferably, thermocompression bonding is performed under the following conditions. Thermocompression bonding is preferably performed at a temperature not lower than the melting point (more preferably, not lower than a decomposition start temperature) of fluororesin material 102, and not higher than a decomposition temperature of fluororesin material 102. As used herein, the term "decomposition start temperature" refers to a temperature at which fluororesin material 102 begins to undergo thermal decomposition, and the term "decomposition temperature" refers to a temperature at which fluororesin material 102 undergoes a 10% decrease in mass due to the thermal decomposition.

A reason why thermocompression bonding is performed at a temperature not lower than the melting point of fluororesin material 102 is that fluororesin material 102 will not be activated at a temperature lower than the melting point. Furthermore, the temperature is set to not lower than the decomposition start temperature of fluororesin material 102, because the C atoms in fluororesin material 102 are converted into radicals, which further activates fluororesin material 102. That is, it is believed that when the temperature of thermocompression bonding is not lower than the melting point of fluororesin material 102, preferably not lower than the decomposition start temperature, bonding of the fluororesin to the layer formed on carrier 100 with the silane coupling agent can be accelerated.

More specifically, a lower limit of the temperature of thermocompression bonding of fluororesin material 102 is preferably a temperature that is 30° C. higher, and more preferably 50° C. higher, than the melting point of fluororesin material 102. In the case of FEP, which has a melting point of about 270° C., thermocompression bonding is preferably performed at a temperature of 300° C. or higher, and more preferably 320° C. or higher. On the other hand, an upper limit temperature of thermocompression bonding is 600° C., and more preferably 500° C. This allows decomposition of fluororesin material 102 to be suppressed.

The pressure is set to not less than 0.01 MPa and not more than 100.0 MPa. The pressurization time is not shorter than 0.01 minute and not longer than 1000 minutes. The pressure and the pressurization time are not restricted, and are set in consideration of the reactivity or the like of the silane coupling agent.

As a result of this thermocompression bonding, it is believed that a C atom in radical form of the fluororesin of fluororesin material 102 is chemically bonded to the siloxane bond (Si—O—Si) formed with the silane coupling agent via another atom or atomic group.

These bonds are presumed to contain a covalent bond, based on the degree of peel strength described below and etching resistance of modified layer 3. This presumption is based on the fact that with a covalent bond, modified layer 3 is resistant to removal due to chemical action (action of the etching treatment, for example). Note that modified layer 3 is a polymer that spreads like a film, and there is a possibility that this polymer and the fluororesin may be strongly bonded to each other with multiple hydrogen bonds being formed between them. Thus, the possibility that these hydrogen bonds and the covalent bond are both present is not excluded.

In a third step, modified layer 3 is exposed by removing at least a portion of carrier 100 (see FIG. 6(C)). The dissolution method or a stripping method may be used to remove carrier 100.

The dissolution method will be described first. When carrier 100 is a sheet made of a base metal, the dissolution method is adopted, because a metal sheet is difficult to strip from fluororesin material 102. In the manufacture of fluororesin base material 1 (base material without conductive pattern 11), the laminate of carrier 100 and fluororesin material 102 is immersed in a solution that dissolves the above-described base metal, thereby completely removing carrier 100.

When a copper material is used as carrier 100, carrier 100 (copper) of the laminate is dissolved in an etchant. As the etchant, an etchant is suitably used that contains iron chloride or copper chloride, and having a specific gravity not less than 1.31 g/cm³ and not more than 1.33 g/cm³ and a free hydrochloric acid concentration not less than 0.1 mol/L and not more than 0.2 mol/L. When the etchant is used, etching is preferably performed under conditions such that the temperature is not lower than 30° C. and not higher than 45° C., and the immersion time is not shorter than 30 seconds and not longer than 2 minutes. Under these conditions, the copper foil can be removed, and the removal of modified layer 3 from fluororesin material 102 can be suppressed.

As a result of the thermocompression bonding between carrier 100 and fluororesin material 102, some of the hydrophilic organofunctional groups of the silane coupling agent are chemically bonded to carrier 100. It is believed that because this chemically bonded portion is exposed to the etchant for the dissolution of carrier 100, it is converted back to the original hydrophilic organofunctional group, or turned into another functional group having a hydroxy group, through hydrolysis.

The stripping method will be described next. In the case of the stripping method, a carrier that is easily stripped from fluororesin material 102 after the thermocompression bonding between carrier 100 and fluororesin material 102 is adopted as carrier 100. For example, a silicone sheet or a metal foil is used as carrier 100. Alternatively, carrier 100 segmented into a plurality of block regions when seen in a plan view may be used, and at least a portion of the plurality of block regions may be stripped.

The use of such carrier 100 simplifies the work of the third step. That is, carrier 100 can be removed from fluororesin material 102 without performing the dissolution treatment. While the stripping method may also be described as a transfer method, it differs from simple transfer in that during transfer, primer material 101 is altered in properties and bonded to fluororesin material 102.

A method of forming modified layer 3 according to this technique will now be described together with a conventional problem.

Because the fluororesin has low wettability, if a method in which a liquid reactant is directly applied to the surface of fluororesin material 102 is used, the reactant will be unevenly distributed and thus, it is difficult to introduce the hydrophilic organofunctional groups evenly to the surface of fluororesin material 102. Conventionally, therefore, a plasma method has been used to modify fluororesin material 102. With plasma, radical species can be easily formed on the surface of fluororesin material 102, which facilitates introduction of hydrophilic groups to the surface of fluororesin material 102. The surface state of the plasma-treated fluororesin material 102, however, is unstable and thus, the surface thereof gradually returns to its original stable state (surface inactive state). The plasma treatment is therefore disadvantageous in that the surface-modified state of fluororesin material 102 cannot be maintained over a long period of time.

In order to solve this problem, according to this technique, primer material 101 containing a silane coupling agent, an alcohol, and water is adhered to carrier 100. Because the surface of carrier 100 has good wettability, primer material 101 in liquid state is evenly applied to the surface of carrier 100.

Moreover, carrier 100 spreads in the form of a film because of the hydrophilic organofunctional group of the silane coupling agent contained in primer material 101. Then, carrier 100 in this state is heated at a temperature around 120° C. to hydrolyze the hydrolyzable silicon-containing functional group containing a Si atom to produce a silanol group. This silanol group is then condensed with another silanol group to form a siloxane bond. Simultaneously, some of the silanol groups and the hydrophilic organofunctional groups are bonded to carrier 100. As a result, it is believed that a polymer film is formed in which the siloxane bond structure is two-dimensionally aligned in a network form.

Then, in this state, carrier 100 and fluororesin material 102 are laminated with primer material 101 being sandwiched between carrier 100 and fluororesin material 102. Carrier 100 and fluororesin material 102 are then subjected to thermocompression bonding at a temperature not lower than the melting point of fluororesin material 102.

Because primer material 101 spreads in the form of a film on carrier 100, it does not become uneven owing to the water repellency of the fluororesin when brought into contact with fluororesin material 102. This may also be attributed to the fact that siloxane bonds are formed during drying and heating of primer material 101, in addition to the fact that primer material 101 is film-shaped. Primer material 101 is thus pressed against fluororesin material 102 with a substantially uniform thickness (with little unevenness). Then, as a result of thermocompression bonding between fluororesin material 102 and carrier 100 at a temperature not lower than the melting point of fluororesin material 102, it is believed that a C atom of the fluororesin is bonded to the siloxane bond formed with the silane coupling agent via another atom or atomic group.

[Method for Manufacturing the Printed Wiring Board]

A method for manufacturing printed wiring board 10 is similar to the above-described method for manufacturing fluororesin base material 1 described above. Thus, the method for manufacturing printed wiring board 10 will be described referring to the above-described method for manufacturing fluororesin base material 1.

In a first step, primer material 101 is adhered to a metal sheet as carrier 100. Primer material 101 contains a silane coupling agent, an alcohol, and water. This step is similar to the first step in the method for manufacturing fluororesin base material 1.

In a second step, the alcohol in primer material 101 adhered to carrier 100 is removed by drying, and then carrier 100 is heated. Carrier 100 and fluororesin material 102 are then laminated with primer material 101 sandwiched therebetween, and are subjected to thermocompression bonding. This step is similar to the second step in the method for manufacturing fluororesin base material 1.

Next, a wiring pattern is formed similarly to an etching method adopted in a conventional method for manufacturing a printed wiring board. For example, a resist pattern is formed on the metal layer as carrier 100, the laminate (laminate of carrier 100, the metal layer, and the resist pattern) is immersed in an etchant, and then the resist pattern is removed. Consequently, conductive pattern 11 is formed.

This printed wiring board 10 in which modified layer 3 is exposed on the surface can make the adhered material such as solder resist, a conductive adhesive, or a cover lay film resistant to peeling, compared to a conventional printed wiring board.

A feature of the method for manufacturing fluororesin base material 1 and the method for manufacturing printed wiring board 10 is that fluororesin material 102 is not subjected to a plasma treatment or alkali treatment. That is, fluororesin base material 1 or printed wiring board 10 having a surface active state can be manufactured without such a treatment. Furthermore, with this manufacturing method, modified layer 3 can be provided in a relatively simple manner on the surface of fluororesin base material 1 or printed wiring board 10.

According to embodiments of the invention, the following effects are achieved.

Fluororesin base material 1 according to an embodiment of the invention is fluororesin base material 1 containing a fluororesin as a main component, the fluororesin base material including modified layer 3 on at least a partial region of a surface thereof, modified layer 3 containing a siloxane bond and a hydrophilic organofunctional group, and a surface of modified layer 3 having a contact angle of 90° or less with pure water. Fluororesin base material 1 is therefore highly reactive. Fluororesin base material 1 is therefore surface active. Moreover, modified layer 3 is stable over time because of its siloxane bonds. That is, fluororesin base material 1 with the above-described structure has a surface-modified state (surface active state) more stable than that of a conventional fluororesin base material.

Preferably, a peel strength of an epoxy resin adhesive having an average thickness of 25 µm against the surface of the modified layer is 1.0 N/cm or more, as measured using a polyimide sheet having an average thickness of 12.5 µm as a flexible adherent. With this structure, the coating material laminated on the surface of the polyimide sheet or the like can be resistant to peeling from fluororesin base material 1. More preferably, the peel strength is 5.0 N/cm or more.

In fluororesin base material 1, modified layer 3 is preferably not removed by an etching treatment in which the modified layer is immersed under conditions of 45° C. and 2 minutes, using an etchant containing iron chloride and having a specific gravity of 1.33 g/cm$^3$ and a free hydrochloric acid concentration of 0.2 mol/L. With this structure, the surface-modified state (surface activity) of fluororesin base material 1 can be maintained even if fluororesin base material 1 on which a metal layer is formed is subjected to the etching treatment. Therefore, when fluororesin base material 1 is subjected to any of various treatments after the etching treatment, it can provide a satisfactory condition after the treatment. For example, a solder resist application treatment and an adhesive application treatment for fluororesin base material 1 are typically performed after etching. Because modified layer 3 is maintained even after fluororesin base material 1 is subjected to the etching treatment, the peel strength of these adhered materials (the solder resist and the adhesive) has a sufficiently high value.

In fluororesin base material 1, the surface of modified layer 3 preferably has a mean surface roughness Ra of 4 µm or less. With this structure, satisfactory high frequency characteristics can be achieved when fluororesin base material 1 is used as a circuit board. Specifically, surface roughness Ra of the bonded surface of the conductive pattern laminated on the surface of the modified layer can be reduced. This reduces the unevenness of a portion where high frequency signals are concentrated due to the skin effect, allowing an electrical current to flow linearly, thus leading to a reduced transmission delay and transmission loss.

In fluororesin base material 1, modified layer 3 preferably has an average thickness of 400 nm or less. With this structure, when fluororesin base material 1 is used as a circuit board, deterioration of high frequency characteristics due to a dielectric loss attributed to a high dielectric constant of modified layer 3 can be suppressed.

In fluororesin base material 1, preferably, the bond between modified layer 3 and fluororesin layer 2 contains a chemical bond. That is, preferably, this bond is either formed of a covalent bond alone, or contains both a hydrogen bond and a covalent bond, rather than being a bond formed through physical action simply owing to an anchor effect resulting from the uneven shape of the boundary between modified layer 3 and fluororesin layer 2. With this structure, the bond between modified layer 3 and the fluororesin becomes stronger than a bond formed between modified layer 3 and fluororesin layer 2 simply through physical action. Therefore, fluororesin base material 1 can maintain the surface-modified state over a long period of time, compared to a fluororesin base material in which modified layer 3 is adhered to the fluororesin simply through physical action owing to the anchor effect or the like.

In fluororesin base material 1, preferably, the hydrophilic organofunctional group is at least one selected from the group consisting of a hydroxy group, a carboxy group, a carbonyl group, an amino group, an amide group, a sulfide group, a sulfonyl group, a sulfo group, a sulfonyldioxy group, an epoxy group, a methacryl group, and a mercapto group. With this structure, the reactivity (including adhesion strength) of the surface of fluororesin base material 1 can be increased.

Printed wiring board 10 preferably includes fluororesin base material 1 described above. With this structure, the adhered material can be resistant to peeling in printed wiring board 10. For example, in printed wiring board 10, the adhered material such as conductive pattern 11, solder resist, a conductive adhesive, an adhesive for fixing a component, or a cover lay film can be resistant to peeling.

Printed wiring board 10 has conductive pattern 11 laminated on at least a portion of the region having modified layer 3 of fluororesin base material 1. That is, conductive pattern 11 is adhered to fluororesin layer 2 with modified layer 3 sandwiched therebetween. Consequently, peeling of conductive pattern 11 can be suppressed.

In printed wiring board 10, the coating material (the covering resin or coating member) is preferably laminated on the surface of modified layer 3. With this structure, the peel strength of the coating material can be higher than that when the coating material is directly adhered to the fluororesin.

Circuit module 20 has printed wiring board 10 described above. With this circuit module 20, the presence of modified layer 3 suppresses peeling of the adhered material adhered to printed wiring board 10, leading to higher reliability of circuit module 20. Moreover, circuit module 20, which has printed wiring board 10 described above, is superior in manufacturability to a circuit module having a conventional fluororesin base material. Furthermore, circuit module 20 is superior in heat resistance to a circuit module having a conventional epoxy resin base material.

The method for manufacturing fluororesin base material 1 includes a first step of adhering primer material 101 containing the silane coupling agent to flat-shaped carrier 100; and a second step of bonding fluororesin material 102 containing a fluororesin as a main component by thermocompression bonding to the surface of carrier 100 on which primer material 101 is adhered. With this method, fluororesin base material 1 having carrier 100 (the metal layer, for example) is formed. Moreover, because primer material 101 is adhered to carrier 100, and then the resulting material is bonded to fluororesin material 102 by thermocompression bonding, modified layer 3 having a relatively uniform thickness with little unevenness can be formed on fluororesin material 102, compared to the case where primer material 101 is directly applied to the fluororesin. Furthermore, modified layer 3 is stable over time because as a result of thermocompression bonding, the silane coupling agent is bonded together to form a siloxane bond. That is, with this manufacturing method, fluororesin base material 1 having a stable surface-modified state can be manufactured.

Preferably, carrier 100 is a metal, a glass, a silicone, carbon, a ceramic, or a composite thereof, and the silane coupling agent has the hydrolyzable silicon-containing functional group and the hydrophilic organofunctional group. The silane coupling agent having the hydrophilic organofunctional group is easily spread on carrier 100 in the form of a film. Moreover, as a result of thermocompression bonding, the hydrolyzable silicon-containing functional group of the silane coupling agent produce a silanol, which then condenses with another silanol to form a siloxane bond. Modified layer 3 containing the siloxane bond is thus formed as a layer between carrier 100 and the fluororesin, which increases the resistance of modified layer 3 to a chemical treatment such as etching. Moreover, because modified layer 3 contains the hydrophilic organofunctional group derived from the silane coupling agent, it has high adhesiveness to carrier 100 and coating material 13 that is to be laminated after the carrier is stripped.

Preferably, the hydrophilic organofunctional group contains a N atom or a S atom. Because the N atom or S atom is likely to be bonded to a C atom in radical form of the fluororesin, the hydrophilic organofunctional group containing the N or S atom is more likely to be bonded to the fluororesin than other functional groups (a group containing C and H only, such as a phenyl group). Consequently, the adhesion strength (that is, the peel strength) between modified layer 3 and the fluororesin can be increased.

Preferably, the method for manufacturing fluororesin base material 1 further includes, after the second step, a third step of removing at least a portion of carrier 100 described above. This allows fluororesin base material 1 to be provided in which modified layer 3 is at least partially exposed. Alternatively, fluororesin base material 1 not having carrier 100 can be manufactured by completely removing carrier 100.

When carrier 100 is a base metal, the above-described dissolution method, that is, a method of exposing modified layer 3 by dissolving carrier 100 with a solution that dissolves the base metal, can be adopted in the third step. The dissolution method can use a conventional etching method for removing carrier 100. Thus, any section of carrier 100 can be removed similarly to the conventional etching method to expose any section of modified layer 3.

When at least a surface layer of carrier 100 is formed of a metal, a glass, a silicone, carbon, a ceramic, or a combination thereof, and segmented into a plurality of block regions when seen in a plan view, a method of exposing modified layer 3 by stripping any of the blocks of carrier 100 from fluororesin material 102 can be used in the third step. With this method, because carrier 100 is removed by being stripped from fluororesin material 102, the manufacturing process of fluororesin base material 1 can be more simplified than the case where carrier 100 is removed by dissolution.

The method for manufacturing printed wiring board 10 includes a first step of adhering primer material 101 containing the silane coupling agent to carrier 100; a second step of bonding fluororesin material 102 containing a fluororesin as a main component by thermocompression bonding to the surface of carrier 100 on which primer material 101 is adhered; and a third step, after the second step, of forming a circuit (conductive pattern 11) by removing a portion of carrier 100 with an etchant. With this method, because primer material 101 is adhered to carrier 100 and then bonded to fluororesin material 102 by thermocompression bonding, modified layer 3 having a relatively uniform thickness with little unevenness can be formed on fluororesin material 102, compared to the case where primer material 101 is directly applied to the fluororesin. Furthermore, modified layer 3 is stable over time because as a result of thermocompression bonding, the silane coupling agent is bonded together to form a siloxane bond. That is, with this structure, printed wiring board 10 having a stable surface-modified state can be manufactured.

Preferably, carrier 100 is copper, and the etchant used in the third step contains iron chloride or copper chloride. With this use of copper as carrier 100 and use of the etchant, a circuit pattern can be formed similarly to a conventional method.

Preferably, the temperature of the thermocompression bonding in the second step is not higher than the decomposition temperature of the fluororesin of the fluororesin material. This allows decomposition of fluororesin material 102 to be suppressed in the manufacturing process.

Preferably, the method further includes the step of laminating coating material 13 onto at least a portion of a circuit-side surface of the laminate containing fluororesin 102, modified layer 3, and the circuit (conductive pattern 11). With this method, at least a portion of printed wiring board 10 is covered with coating material 13, which leads to improved reliability or an increased bending strength. That is, because metal carrier 100 is covered with coating material 13, the circuit pattern formed by carrier 100 is protected against oxidation and the like. Furthermore, because modified layer 3 is covered with coating material 13, the bending strength of that portion is increased.

EXAMPLES

While the present invention will be described in detail below based on examples, the invention is not to be construed in a restrictive sense based on these examples.

[Test 1]

Table 1 shows results of a peel strength test for fluororesin base materials 1 according to the present embodiments and comparative fluororesin base materials.

Samples (samples 1 and 2) for use in this test were formed as follows. As a fluororesin sheet forming fluororesin base material 1 (corresponding to fluororesin base material 102 described above), FEP having an average thickness of 0.05 mm, a dimensional width of 10 mm, and a length of 500 mm ("FEP-NE-2" from Daikin Industries, Ltd.) was used.

Modified layer 3 was formed as follows. An aminosilane was used as a silane coupling agent for primer material 101. Ethanol was used as an alcohol for primer material 101. Water was not added. That is, water present in air and water contained in the alcohol as an impurity was used. The concentration of the silane coupling agent was 1 mass % based on the total mass of primer material 101. A copper foil (average thickness: 18 μm, mean surface roughness Ra: 0.6 μm) was used as carrier 100. Primer material 101 was adhered to the copper foil as carrier 100 using the immersion method, dried, and heated at 120° C. A layer of primer material 101 was thus formed on the copper foil. This copper foil was then bonded to the fluororesin sheet by thermocompression bonding. All of the copper foil was then removed with an etchant. A modified layer thus formed had an average thickness of 30 nm, as measured with an electron microscope.

In the etching treatment, etching was performed under conditions of a temperature of 45° C. and an immersion time of 2 minutes, with an etchant containing iron chloride adjusted to give a specific gravity not less than 1.31 g/cm³ and not more than 1.33 g/cm³ and a free hydrochloric acid concentration not less than 0.1 mol/L and not more than 0.2 mol/L.

Sample 1 was washed with water after the etching treatment and dried. Immediately after that, fluororesin base material 1 was coated with a test polyimide sheet having an epoxy resin adhesive layer with an average thickness of 25 μm and a polyimide layer with an average thickness of 12.5 μm. As the test polyimide sheet, one of cover lays of the "CM type" from Arisawa Manufacturing Co., Ltd. which uses "Apical (registered trademark) NPI" from Kaneka Corporation as the polyimide sheet was used. After the passage of 24 hours, the peel strength of the test polyimide sheet was measured. The peel strength (hereinafter referred to as the test polyimide sheet peel strength) was measured using the method in accordance with JIS-K-6854-2 (1999): "Adhesives—Determination of peel strength of adhered assemblies—Part 2: 180° peel".

Sample 2 was washed with water after the etching treatment, dried, and then left standing in an air atmosphere over 1 week. Fluororesin base material 1 was then coated with the test polyimide sheet. After the passage of 24 hours, the test polyimide sheet peel strength was measured.

As for each of the comparative fluororesin base materials (samples 3 and 4), on the other hand, the above-described fluororesin sheet (FEP having an average thickness of 0.05 mm, an average width of 10 mm, and an average length of 500 mm ("FEP-NE-2" from Daikin Industries, Ltd.)) was plasma-treated. $N_2$ was used as a carrier gas. $CF_4$ and $O_2$ were used as reactant gases. The volume ratio of the carrier gas to the reactant gases was 1650/1000 (carrier gas/reactive gases). The plasma treatment was performed for 30 minutes with a capacitively coupled plasma device, at a gas pressure of 27 Pa, a flow rate of 1650 sccm, and power of 5000 W.

Immediately after the plasma treatment of sample 3, the (plasma-treated) fluororesin base material was coated with the test polyimide sheet. After the passage of 24 hours, the test polyimide sheet peel strength was measured.

Sample 4 was left standing in an air atmosphere over 1 week. The (plasma-treated) fluororesin base material was then coated with the test polyimide sheet. After the passage of 24 hours, the test polyimide sheet peel strength was measured. The measurement results of peel strength are shown in Table 1.

ment, the peel strength of the polyimide sheet against the fluororesin base material according to the present embodiment is higher than the peel strength of the polyimide sheet against the plasma-treated fluororesin sheet.

(2) In the plasma-treated fluororesin sheet, the polyimide sheet shows a substantial decrease in peel strength due to being left standing over 1 week. In contrast, in fluororesin base material 1 according to the present embodiment, the peel strength is maintained to a certain degree, although it shows a slight decrease after being left standing over 1 week. This shows that the modified layer formed on fluororesin base material 1 is stable.

Note that the change ratio shown in Table 1 is a value calculated in accordance with $\{(PB-PA)/PA\}\times 100(\%)$. In the equation, each of "PA" and "PB" represents the following. "PA" represents the test polyimide sheet peel strength measured as follows. After the formation of the modified layer on the fluororesin sheet to be tested, the fluororesin sheet was washed and dried. Immediately after that, the test polyimide sheet was adhered to the fluororesin sheet. After the passage of 24 hours, the peel strength was measured. "PB" represents the test polyimide sheet peel strength measured as follows. After the formation of the modified layer on the fluororesin sheet to be tested, the fluororesin sheet was washed and dried. The fluororesin sheet was left standing in an air atmosphere over 1 week, and then the test polyimide sheet was adhered to the fluororesin sheet. After the passage of 24 hours, the peel strength was measured.

This test compares the peel strengths of the polyimide sheets adhered with the epoxy resin adhesive. Regardless of the type of the adhesive, however, there is a tendency toward the result (2). That is, regardless of the type of the adhesive, plasma-treated fluororesin sheets tend to substantially lose their surface activity after being left standing over 1 week. On the other hand, fluororesin base material 1 according to the present embodiment has adhesiveness not only to the epoxy resin adhesive but also to an adhesive containing as a main component a polyimide, a polyester, a polyamide, or the like, and substantially maintains its adhesiveness even after the passage of 1 week. That is, fluororesin base material 1 according to the present embodiment shows little decrease in surface activity even after being left standing over 1 week.

[Test 2]

Ten samples were prepared individually for sample 1 of the fluororesin base material immediately after the etching

TABLE 1

|  | Adhered Material | Object Coated with Adhered Material | Peel Strength PA (N/cm) of Adhered Material Adhered Immediately after Treatment | Peel Strength PB (N/cm) of Adhered Material Adhered after Being Left Standing over 1 Week | Change Ratio (%) |
|---|---|---|---|---|---|
| Sample 1 | Polyimide Sheet | Fluororesin Base Material with Modified Layer | 5 |  | −4 |
| Sample 2 |  |  |  | 4.8 |  |
| Sample 3 | Polyimide Sheet | Fluororesin Sheet + Plasma Treatment | 3 |  | −93 |
| Sample 4 |  |  |  | 0.2 |  |

[Results]

(1) As shown in Table 1, for the samples in which the adhered material was adhered immediately after the treatment, washing and drying in test 1 described above and for a fluororesin sheet ("FEP-NE-2" from Daikin Industries, Ltd.) prior to the formation of the modified layer, and their contact angle with pure water was measured using the sessile drop method under JIS-R-3257 (1999).

As a result, the contact angle of pure water on the surface of the modified layer of sample 1 of the fluororesin base material was found to be distributed within the range not less than 500 and not more than 90°. On the other hand, the contact angle of pure water on the surface of the fluororesin sheet not having the modified layer was found to be distributed within the range not less than 95° and not more than 130°. Therefore, the fluororesin base material having the modified layer, which clearly shows a reduced contact angle of its surface with pure water, has been demonstrated to have improved hydrophilicity.

[Test 3]

Table 2 shows results of the peel strength test for printed wiring boards 10 according to the present embodiments. The test conditions will be described below.

Sample nos. 1 to 8 to be tested in a reliability test were formed as follows.

As a fluororesin sheet forming fluororesin base material 1 (corresponding to fluororesin base material 102 described above), FEP having an average thickness of 0.05 mm, an average width of 10 mm, and an average length of 500 mm ("NF-0050" from Daikin Industries, Ltd.) was used for sample nos. 1, 2, 5, and 6. PFA ("AF-0050" from Daikin Industries, Ltd.) was used for sample nos. 3, 4, 7, and 8.

Modified layer 3 was formed with primer material 101 described below. An aminosilane was used as a silane coupling agent for primer material 101. Ethanol was used as an alcohol for primer material 101. Water was not added. That is, water present in air and water contained in the alcohol as an impurity was used. The concentration of the silane coupling agent was 1 mass % based on the total mass of primer material 101. A copper foil (average thickness: 18 µm, mean surface roughness Ra: 0.6 µm) was used as carrier 100. Primer material 101 was adhered to the copper foil as carrier 100 using the immersion method, dried, and heated at 120° C. A layer of primer material 101 was thus formed on the copper foil. This primer layer had an average thickness of 30 nm. This copper foil was then bonded to the fluororesin sheet by thermocompression bonding.

Next, 25 copper traces with an average thickness of 18 µm, an average width of 100 µm, and an average pitch of 100 µm were formed using an etching method. In the etching treatment, etching was performed under conditions of a temperature of 45° C. and an immersion time of 2 minutes, with an etchant containing iron chloride adjusted to give a specific gravity not less than 1.31 g/cm$^3$ and not more than 1.33 g/cm$^3$ and a free hydrochloric acid concentration not less than 0.1 mol/L and not more than 0.2 mol/L.

The copper traces were then coated with a polyimide sheet (test polyimide sheet) having an epoxy resin adhesive layer with an average thickness of 25 µm and a polyimide layer with an average thickness of 12.5 µm.

As the reliability test, printed wiring boards 10 described above were left standing for 100 hours under conditions of a relative humidity of 85% and a temperature of 85° C.

For the copper traces and the polyimide sheet, the test polyimide sheet peel strength was measured before and after the reliability test. Portions adjacent to each other before or after the reliability test were used as the portions to be measured for peel strength.

TABLE 2

| | Adhered Material | Peel Strength P1 (N/cm) before Reliability Test | Peel Strength P2 (N/cm) after Reliability Test | Change Ratio (%) |
|---|---|---|---|---|
| No. 1 | Copper Traces | 3.0 | 3.0 | 0 |
| No. 2 | Copper Traces | 7.0 | 7.0 | 0 |
| No. 3 | Copper Traces | 1.0 | 1.0 | 0 |
| No. 4 | Copper Traces | 9.0 | 8.7 | −3 |
| No. 5 | Polyimide Sheet | 9.0 | 9.0 | 0 |
| No. 6 | Polyimide Sheet | 1.0 | 1.0 | 0 |
| No. 7 | Polyimide Sheet | 6.5 | 6.2 | −5 |
| No. 8 | Polyimide Sheet | 2.5 | 2.4 | −4 |

[Results]

(1) As shown in Table 2, in each of sample nos. 1 to 8, the peel strength before the reliability test is equal to or more than 1.0 N/cm used as a reference. Note that as for samples on which the copper traces were formed in a manner similar to that for sample no. 1 described above after plasma irradiation without forming modified layer 3, the peel strength before the reliability test for each sample had a value smaller than 1.0 N/cm used as the reference.

(2) Furthermore, in sample nos. 1 to 8, the change ratio of peel strength before and after the reliability test is low. That is, the change ratio of peel strength, {(P2−P1)/P1}×100(%), is within ±10% of the reference. Therefore, in each of printed wiring boards 10 according to the present embodiments, the peel strength of conductive pattern 11 and the polyimide sheet (coating member) is high, and the change ratio of peel strength before and after the reliability test is low.

(3) Furthermore, although not shown in Tables 1 and 2, an etching resistance test was performed for samples (nos. 11 to 18) prepared under the same conditions as those for sample nos. 1 to 8. Note that in each of these samples, the copper foil was completely removed by etching, and no copper traces were formed. That is, only modified layer 3 was formed on the surface of the fluororesin base material. Then, in order to examine the etching resistance of the fluororesin base material (including modified layer 3), the fluororesin base material was immersed for 2 minutes in an etchant adjusted to a temperature of 45° C., a specific gravity not less than 1.31 g/cm$^3$ and not more than 1.33 g/cm$^3$, and a free hydrochloric acid concentration not less than 0.1 mol/L and not more than 0.2 mol/L. Furthermore, test polyimide sheet peel strengths before and after this etching test were compared. As a result, for each sample, the change ratio of peel strength was within ±10%. As used herein, the term "change ratio" represents a value given in accordance with the equation {(peel strength after the etching test−peel strength before the etching test)/(peel strength before the etching test)}×100(%). That is, the foregoing results show that, in consideration of the fact that the etching rate decreases with decreasing temperature, modified layer 3 has etching resistance against at least an etching treatment in which modified layer 3 is immersed under conditions of 45° C. or lower and 2 minutes or shorter, using an etchant having a specific gravity not less than 1.31 g/cm$^3$ and not more than 1.33 g/cm$^3$ and a free hydrochloric acid concentration not less than 0.1 mol/L and not more than 0.2 mol/L.

When fluororesin base material 1 including a copper foil (fluororesin base material 1 including modified layer 3 sandwiched between the copper foil and fluororesin base material 1) is subjected to an etching treatment in which it is immersed in the above-described etchant under conditions of 45° C. or lower and 2 minutes or shorter, the time during which exposed modified layer 3 is exposed to the etchant will be shorter than 2 minutes. Thus, when fluororesin base material 1 is etched under these conditions, it is believed that deterioration of modified 3 is further reduced.

(4) Furthermore, although not shown in Tables 1 and 2, samples (nos. 21 to 28) prepared under the same conditions as those for sample nos. 1 to 8 described above were tested for their contact angle with pure water (hereinafter referred to as the "contact angle with water"). As a result, the contact angle with pure water for PFA before the modified layer formation treatment was 1150 on average, and the contact angle with pure water for FEP before the modified layer formation treatment was 114° on average. In contrast, for PFA (or FEP) in which a copper foil was adhered thereto with the primer material sandwiched therebetween, and then this copper foil was etched away, the contact angle with water decreased to 60° to 80° in every sample. That is, it has been demonstrated that hydrophilicity was imparted by the modified layer formation treatment (treatment in which a copper foil is adhered to the fluororesin with the primer material sandwiched therebetween, and then this copper foil is removed). With the modified layer formation treatment, therefore, adhesion strength with an epoxy adhesive or the like for the surface to be etched away can be increased compared to that in an untreated fluororesin.

Other Embodiments

It should be understood that the embodiments disclosed herein are illustrative and non-restrictive in every respect. It is intended that the scope of the present invention is defined by the terms of the claims, instead of being limited to the foregoing embodiments, and includes all modifications within the scope and meaning equivalent to the claims.

With the manufacturing method described above, modified layer 3 can be formed in a desired portion of fluororesin material 102. This can also be utilized to provide a predetermined portion (that is, a portion other than the region where modified layer 3 is formed) with water repellency, which is an inherent property in the fluororesin. For example, fluororesin base material 1 having modified layer 3 only on one surface thereof is useful as a waterproof sheet.

While printed wiring board 10 is a substrate having one insulating layer (fluororesin base material 1), a multilayer printed wiring board can be formed by laminating the above-described fluororesin base materials 1 and the above-described printed wiring boards 10 similarly to a conventional method for manufacturing a multilayer printed wiring board. Because each of the above-described fluororesin base material 1 and printed wiring board 10 has modified layer 3, fluororesin base material 1 and printed wiring board 10 can be strongly adhered to each other with an adhesive therebetween. Thus, a highly reliable multilayer printed wiring board can be provided using fluororesin base material 1 and printed wiring board 10.

Because of its flexibility, fluororesin base material 1 can be used as a base material of a flexible wiring board. A flexible wiring board including fluororesin base material 1 as a base layer features a signal transmission loss lower than that of a flexible wiring board including a conventional polyimide as a base material.

Fluororesin base material 1 having carrier 100 made of a metal is used as a material of printed wiring board 10, for example. On the other hand, fluororesin base material 1 without carrier 100 is useful as a coating member. While conventional fluororesin base materials have been difficult to use as coating members (cover films, for example) because of their low adhesion strength, fluororesin base material 1 of the invention can be adhered to various types of substrates with an adhesive therebetween, because of its reactivity to the adhesive owing to the presence of modified layer 3.

A method for manufacturing the multilayer printed wiring board having the fluororesin as an insulating layer can include at least the first step and the second step described in the present embodiments. That is, in the manufacturing process of the multilayer printed wiring board, fluororesin base material 1 is formed by the first and second steps. Then, structures on which circuit patterns are formed by removing a portion of carrier 100 of fluororesin base material 1 are laminated with an adhesive therebetween. Because the adhesive can be brought into contact with modified layer 3, the adherence of one fluororesin base material 1 to another fluororesin base material 1 is improved compared to that in a multilayer printed wiring board without modified layer 3.

[Additional Description]

The foregoing embodiments disclose a technical concept concerning a circuit module including a fluororesin base material, wiring and an electronic component arranged on the fluororesin base material, and a coating material covering at least the wiring, each of the fluororesin base material and the coating material being a fluororesin base material containing a fluororesin as a main component, the fluororesin base material having a modified layer formed on at least a partial region of a surface thereof, the modified layer containing a siloxane bond and a hydrophilic organofunctional group, and a surface of the modified layer having a contact angle of 90° or less with pure water.

That is, in this circuit module, at least the wiring is sandwiched between the fluororesin base materials described in the present embodiments. This structure results in a circuit module with a signal transmission loss lower than that of a circuit module including a polyimide resin as a coating material. Moreover, by virtue of the properties of the fluororesin, this circuit module has high heat resistance and high chemical resistance.

Furthermore, the foregoing embodiments disclose a technical concept concerning a method for manufacturing a fluororesin base material including a first step of adhering a primer material containing a silane coupling agent to a flat plate-like carrier; and a second step of bonding a fluororesin material containing a fluororesin as a main component by thermocompression bonding to a surface of the carrier on which the primer material is adhered, wherein a modified layer is formed between the carrier and the fluororesin material.

With this structure, a fluororesin base material is formed having a carrier and having excellent adhesion to this carrier. Moreover, because the primer material is adhered to the carrier, and then the resulting material is bonded to the fluororesin material by thermocompression bonding, a modified layer having little unevenness in thickness can be formed on the fluororesin material, compared to the case where the primer material is simply applied to the fluororesin. Furthermore, the modified layer is stable over time because as a result of thermocompression bonding, the silane coupling agent is bonded together to form a siloxane bond. This modified layer also has increased resistance to a chemical treatment such as etching. That is, with this structure, a fluororesin base material having a stable surface-modified state can be manufactured.

Preferably, the material of at least a surface layer of the carrier is a metal, a glass, a silicone, carbon, a ceramic, or a composite thereof, and the silane coupling agent has a hydrolyzable silicon-containing functional group and a hydrophilic organofunctional group. The use of this carrier and the silane coupling agent having the above-described functional group facilitates spreading of the silane coupling agent in the form of a film.

Preferably, the hydrophilic organofunctional group contains a N atom or a S atom. With this structure, the adhesion strength (that is, the peel strength) between the modified layer and the fluororesin can be increased.

Preferably, the method further includes, after the second step, a third step of removing at least a portion of the carrier. With this structure, a fluororesin base material can be provided in which the modified layer is at least partially exposed. Alternatively, a fluororesin base material not having the carrier can be manufactured by completely removing the carrier.

When the material of the carrier is a base metal, a solution that dissolves the base metal may be used to remove the carrier in the third step. With this structure, because the carrier is removed with the solution, a conventional etching method can be adopted to remove the carrier. Thus, any section of the carrier can be removed similarly to the conventional etching method to expose any section of the modified layer.

The carrier may be segmented into a plurality of block regions when seen in a plan view, and at least a portion of the plurality of block regions may be stripped in removing the carrier in the third step. With this structure, the carrier can be removed in a simple manner because the carrier is removed from the fluororesin by stripping. This can simplify the manufacturing process of the fluororesin base material more than the case where the carrier is removed by dissolution.

Furthermore, the foregoing embodiments disclose a technical concept concerning a method for manufacturing a printed wiring board including a first step of adhering a primer material containing a silane coupling agent to a flat plate-like carrier made of a base metal; a second step of bonding a fluororesin material containing a fluororesin as a main component by thermocompression bonding to a surface of the carrier on which the primer material is adhered; and a third step, after the second step, of forming a circuit by removing a portion of the carrier with an etchant, wherein a modified layer is formed between the carrier and the fluororesin material in the second step.

With this structure, because the primer material is adhered to the carrier, and then the resulting material is bonded to the fluororesin material by thermocompression bonding, a modified layer with little unevenness in thickness and having high adhesion strength to the carrier can be formed on the fluororesin material. Furthermore, the modified layer is stable over time because as a result of thermocompression bonding, the silane coupling agent is bonded together. That is, with this structure, a printed wiring board having a stable surface-modified state can be manufactured.

When the material of the carrier is copper or a copper alloy, the etchant used in the third step preferably contains iron chloride or copper chloride. With this use of copper as the carrier and use of the etchant, a circuit pattern can be formed from the carrier similarly to a conventional method.

The temperature of the thermocompression bonding in the second step may be not higher than the decomposition temperature of the fluororesin of the fluororesin material. This allows decomposition of the fluororesin material to be suppressed in the manufacturing process.

The method may further include the step of laminating a coating material onto at least a portion of a circuit-side surface of a laminate including the modified layer and the circuit. With this structure, at least a portion of the printed wiring board is covered with the coating material, which leads to improved reliability or an increased bending strength. That is, because the metal carrier is covered with the coating material, the circuit pattern formed by the carrier is protected against oxidation and the like. Furthermore, because the modified layer is covered with the coating material, the bending strength of that portion is increased.

INDUSTRIAL APPLICABILITY

The fluororesin base material, the printed wiring board, and the circuit module according to the embodiments of the present invention can be suitably used in order to reduce the transmission delay and transmission loss particularly in high frequency circuits.

REFERENCE SIGNS LIST

1: fluororesin base material; 2: fluororesin layer; 3: modified layer; 10, 10X: printed wiring board; 11: conductive pattern; 13: coating material; 14: adhesive layer; 15: protective layer; 16: central portion; 20: circuit module; 21: electronic component, 100: carrier; 101: primer material; 102: fluororesin material; and 900: press machine.

The invention claimed is:

1. A printed wiring board comprising a fluororesin base material and a metal layer,
   the fluororesin base material containing a fluororesin layer and a modified layer,
   the metal layer being disposed on the modified layer,
   the fluororesin layer containing a fluororesin as a main component,
   a content of the fluororesin in the fluororesin base material being 90 mass % or more based on a total mass of the fluororesin base material,
   the fluororesin containing a tetrafluoroethylene-hexafluoropropylene copolymer,
   the modified layer being disposed on a partial region of a surface of the fluororesin layer in the fluororesin base material,
   the modified layer containing a siloxane bond and a hydrophilic organofunctional group,
   a surface of the modified layer having a contact angle of 90° or less with pure water,
   the surface of the fluororesin layer not having the modified layer having a contact angle of 95° to 130° with pure water, wherein
   a C atom in radical form of the fluororesin is covalently bonded to the siloxane bond (Si—O—Si) formed with a silane coupling agent via another atom or atomic group,
   the fluororesin base material has an optical transmittance of 50% or more at a wavelength of 600 nm, and
   the surface of the modified layer has a mean surface roughness Ra of 4 μm or less.

2. The printed wiring board according to claim 1, wherein a peel strength of an epoxy resin adhesive having an average thickness of 25 μm against the surface of the modified layer is 1.0 N/cm or more, as measured using a cover lay having a lamination of a polyimide sheet and the epoxy resin adhesive, the polyimide sheet having an average thickness of 12.5 μm.

3. The printed wiring board according to claim 1, wherein the modified layer is not removed by an etching treatment in which the modified layer is immersed under conditions of 45° C. and 2 minutes, using an etchant containing iron chloride and having a specific gravity of 1.33 g/cm³ and a free hydrochloric acid concentration of 0.2 mol/L.

4. The printed wiring board according to claim 1, wherein the modified layer has an average thickness of 400 nm or less.

5. The printed wiring board according to claim 1, wherein the hydrophilic organofunctional group is a hydroxy group, a carboxy group, a carbonyl group, an amino group, an amide group, a sulfide group, a sulfonyl group, a sulfo group, a sulfonyldioxy group, an epoxy group, a methacryl group, a mercapto group, or a combination thereof.

6. The printed wiring board according to claim 1, wherein the metal layer is a conductive pattern.

7. The printed wiring board according to claim 1, wherein the printed wiring board includes a coating material laminated on the surface of the modified layer of the fluororesin base material.

8. The printed wiring board according to claim 1, wherein the surface of the modified layer has a mean surface roughness Ra of 1 μm or less.

9. A circuit module comprising the printed wiring board according to claim 1.

10. A printed wiring board comprising a fluororesin base material and a metal layer,
the fluororesin base material containing a fluororesin layer and a modified layer,
the metal layer being disposed on the modified layer,
the fluororesin layer containing a fluororesin as a main component,
a content of the fluororesin in the fluororesin base material being 90 mass % or more based on a total mass of the fluororesin base material,
the modified layer being disposed on a partial region of a surface of the fluororesin layer in the fluororesin base material,
the modified layer containing a siloxane bond and a hydrophilic organofunctional group,
a surface of the modified layer having a contact angle of 90° or less with pure water,
a C atom in radical form of the fluororesin is covalently bonded to the siloxane bond (Si—O—Si) formed with a silane coupling agent via another atom or atomic group,
the fluororesin base material has an optical transmittance of 50% or more at a wavelength of 600 nm, and
the surface of the modified layer has a mean surface roughness Ra of 4 μm or less.

11. The printed wiring board according to claim 10, wherein
a peel strength of an epoxy resin adhesive having an average thickness of 25 μm against the surface of the modified layer is 1.0 N/cm or more, as measured using a cover lay having a lamination of a polyimide sheet and the epoxy resin adhesive, the polyimide sheet having an average thickness of 12.5 μm.

12. The printed wiring board according to claim 10, wherein
the modified layer is not removed by an etching treatment in which the modified layer is immersed under conditions of 45° C. and 2 minutes, using an etchant containing iron chloride and having a specific gravity of 1.33 g/cm³ and a free hydrochloric acid concentration of 0.2 mol/L.

13. The printed wiring board according to claim 10, wherein
the modified layer has an average thickness of 400 nm or less.

14. The printed wiring board according to claim 10, wherein
the hydrophilic organofunctional group is a hydroxy group, a carboxy group, a carbonyl group, an amino group, an amide group, a sulfide group, a sulfonyl group, a sulfo group, a sulfonyldioxy group, an epoxy group, a methacryl group, a mercapto group, or a combination thereof.

15. The printed wiring board according to claim 10, wherein
the metal layer is a conductive pattern.

16. The printed wiring board according to claim 10, wherein
the printed wiring board includes a coating material laminated on the surface of the modified layer of the fluororesin base material.

17. The printed wiring board according to claim 10, wherein
the surface of the modified layer has a mean surface roughness Ra of 1 μm or less.

* * * * *